(12) United States Patent
Otsuka et al.

(10) Patent No.: US 8,003,930 B2
(45) Date of Patent: Aug. 23, 2011

(54) AMBIENT LIGHT SENSOR

(75) Inventors: Shinichi Otsuka, Kyoto (JP); Yuichiro Nakata, Kyoto (JP); Junji Fujino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/906,839

(22) Filed: Oct. 18, 2010

(65) Prior Publication Data
US 2011/0114825 A1    May 19, 2011

Related U.S. Application Data

(63) Continuation of application No. 12/277,618, filed on Nov. 25, 2008, now Pat. No. 7,838,811.

(30) Foreign Application Priority Data

Dec. 3, 2007    (JP) .................................. 2007-311906
Dec. 3, 2007    (JP) .................................. 2007-311909
Nov. 17, 2008  (JP) .................................. 2008-293624

(51) Int. Cl.
*H01J 40/14*    (2006.01)

(52) U.S. Cl. .......... 250/214 AL; 250/214 A; 250/214 B; 327/515

(58) Field of Classification Search .............. 250/214 R, 250/214 A, 214 AL, 214 B, 214 C; 327/403, 327/407, 514, 515
See application file for complete search history.

(56) References Cited

U.S. PATENT DOCUMENTS

| | | | |
|---|---|---|---|
| 3,943,380 A | 3/1976 | Morgan et al. | |
| 7,838,811 B2 * | 11/2010 | Otsuka et al. | 250/214 AL |
| 2009/0146048 A1 * | 6/2009 | Chiba | 250/214 A |

FOREIGN PATENT DOCUMENTS
JP    2002-176192    6/2002
* cited by examiner

*Primary Examiner* — Kevin Pyo
(74) *Attorney, Agent, or Firm* — Fish & Richardson P.C.

(57) ABSTRACT

In an ambient light sensor according to the present invention, a current amplification portion which amplifies a light current obtained by a light receiving portion to generate an output signal includes: a current amplification stage that has: a first current mirror amplifier which is composed of a bipolar transistor, and a second current mirror amplifier which is composed of a field effect transistor connected in parallel with the first current mirror amplifier; and a changeover control circuit which monitors an amplified current input into the current amplification stage, and performs changeover control of the first and second current mirror amplifiers according to a value of the amplified current.

17 Claims, 25 Drawing Sheets

| PIN No. | TERMINAL NAME | INPUT/OUTPUT EQUIVALENT CIRCUIT | FUNCTION |
|---|---|---|---|
| 1 | IOUT | | This terminal outputs a current that depends on illumination. This is used with a registor disposed across this terminal and GND. |
| 2 | GND | | GND TERMINAL |
| 3 | VCC | | POWER-SUPPLY VOLTAGE TERMINAL |
| 4 | NC | | NC TERMINAL Open this terminal or short-circuit it To GND |
| 5 | GC1 | | MODE SETTING TERMINAL 1 |
| 6 | GC2 | | MODE SETTING TERMINAL 2 |

FIG. 2

| ITEM | SYMBOL | VALUE | UNIT | CONDITION |
|---|---|---|---|---|
| CONSUMED CURRENT 1 (DURING OPERATION) | Icc1 | 51~97 | uA | Ev=100 1x (H GAIN MODE) ※ |
| CONSUMED CURRENT 2 (0 1x) | Icc2 | 4.5~13.5 | uA | Ev=0 1x (H GAIN MODE) |
| CONSUMED CURRENT 3 (DURING SHUTDOWN) | Icc3sd | 0.2~0.4 | uA | $V_{Gc1}=V_{Gc2}=0$ DURING THE TIME OF NO INPUT LIGHT |
| IOUT OUTPUT CURRENT 1 (DARK CURRENT) | Iout1 | 0.2 | uA | Ev=0 1x |
| IOUT OUTPUT CURRENT 2 | Iout2 | 51~69 | uA | Ev=100 1x (H GAIN MODE) ※ |
| SATURATED OUTPUT VOLTAGE | Vomax | 2.4~3.0 | V | Ev=100 1x, RL=220kΩ (H GAIN MODE) ※ |
| GC1, GC2 INPUT 'L' VOLTAGE | $V_{IL}$ | 0~0.4 | V | |
| GC1, GC2 INPUT 'H' VOLTAGE 1 | $V_{IH1}$ | 1.4~VCC | V | 2.4V ≦ VCC ≦ 3.6V |
| GC1, GC2 INPUT 'H' VOLTAGE 2 | $V_{IH2}$ | 2.0~VCC | V | 3.6V ≦ VCC ≦ 5.5V |
| WAKE-UP TIME | twu | 45~128 | us | SHUTDOWN→H GAIN MODE Ev=100 1x ※ |
| GAIN RATIO H GAIN MODE / M GAIN MODE | rHM | 9.5~10.5 | TIME | Ev=100 1x ※ |
| GAIN RATIO M GAIN MODE / L GAIN MODE | rML | 9.5~10.5 | TIME | Ev=100 1x ※ |

※ A quasi white LED is used as the light source

| PDv1-1 AREA PROPORTION 12.8 | PDv3-1 AREA PROPORTION 15.25 | | PDv2-1 AREA PROPORTION 12.8 |
|---|---|---|---|
| PDir1-1 AREA PROPORTION 5.85 | PDir2 AREA PROPORTION 4.5 | PDir3 A/P 1.7 | PDir1-2 AREA PROPORTION 5.85 |
| PDv2-2 AREA PROPORTION 12.8 | PDv3-2 AREA PROPORTION 15.25 | | PDv1-2 AREA PROPORTION 12.8 |

FIG. 15

|  | GC2 | GC1 | GAIN (UNIT: TIME) | | | | |
|---|---|---|---|---|---|---|---|
|  |  |  | AMP1 | AMP2 | AMP3 | AMP4 | TOTAL |
| SD | L | L | 16 | 0 | 0 | 0 | 0 |
| H GAIN | L | H | 16 | 10 | (17.5) | 23 | 64400 |
| M GAIN | H | L | 16 | 1 | (17.5) | 23 | 6440 |
| L GAIN | H | H | 16 | 1 | (1.75) | 23 | 644 |

AMBIENT LIGHT SENSOR

CROSS-REFERENCE TO RELATED APPLICATIONS

This application is a continuation of (and claims the benefit of priority of) U.S. application Ser. No. 12/277,618, filed on Nov. 25, 2008, which in turn is based on the following Japanese Patent Applications:

[1] No. 2007-311906 (the filing date: Dec. 3, 2007)
[2] No. 2007-311909 (the filing date: Dec. 3, 2007)
[3] No. 2008-293624 (the filing date: Nov. 17, 2008), the contents of which are hereby incorporated by reference.

BACKGROUND OF THE INVENTION

1. Field of the Invention

The present invention relates to an ambient light sensor which detects ambient illumination.

2. Description of Related Art

Conventionally, electronic apparatuses that use an ambient light sensor to detect ambient illumination and carry out various kinds of control according to the detected results are in practical use. For example, in the field of photographing apparatuses, typically, a digital still camera and a digital camcorder, exposure control and flash control are carried out according to a detected result from an ambient light sensor. Besides, in the field of liquid crystal display apparatuses, typically, a liquid crystal display television and a liquid crystal display monitor, brightness control of a backlight is carried out according to a detected result from an ambient light sensor.

As an example of the conventional art related to the technology described above, there is JP-A-2002-176192 which is disclosed and proposed by the applicant of the present patent application.

Generally, the conventional ambient light sensor has a structure in which a photoelectric transducing device such as a photodiode and the like is used to generate a light current depending on ambient illumination, and the light current is amplified by a current mirror amplifier to generate a desired output signal (output current).

Because of this, in an ambient light sensor that has the structure described above, to obtain an output signal proportionate to ambient illumination, it is necessary to keep always the mirror ratio of the current mirror amplifier at a constant value.

However, in a case where the current mirror amplifier is composed of a bipolar transistor, the output signal is saturated as the light current increases, and the mirror ratio of the current mirror amplifier deviates from a predetermined target value, accordingly, linearity of the output signal is kept in only a region where the light current is relatively small.

On the other hand, in a case where the current mirror amplifier is composed of a MOS (Metal Oxide Semiconductor) Field Effect Transistor, fluctuation in the output signal becomes large as the light current becomes small, and the mirror ratio of the current mirror amplifier deviates from a predetermined target value, accordingly, linearity of the output signal is kept in only a region where the light current is relatively large.

In the field of ambient light sensors, a technology is developed, in which calculation of a difference between light currents that are separately generated by a first and second photoelectric transducing devices which are different from each other in light receiving characteristic (spectral sensitivity) is carried out, thereby only a desired wavelength is measured.

However, because the ambient light sensor described above is so structured as to always carry out a difference between the light signals according to a constant proportion, depending on certain kinds of light sources whose illuminations are measured, the difference calculation result becomes below zero, and the output signal becomes zero, accordingly, there is a problem that exact measurement of illuminations of the light sources cannot be carried out.

SUMMARY OF THE INVENTION

The present invention has been made to cope with the conventional problems, and it is an object of the present invention to provide an ambient light sensor which is capable of keeping excellent linearity of an output signal in a wide illumination range.

To achieve the object, an ambient light sensor according to the present invention comprises: a light receiving portion which generates a light current that depends on ambient illumination; and a current amplification portion which amplifies a light current obtained by the light receiving portion to generate an output signal, wherein the current amplification portion includes: a current amplification stage that has: a first current mirror amplifier which is composed of a bipolar transistor; and a second current mirror amplifier which is composed of a field effect transistor connected in parallel with the first current mirror amplifier, and a changeover control circuit which monitors an input current to the current amplification stage, and performs changeover control of the first and second current mirror amplifiers according to a value of the input current.

Other features, elements, steps, advantages, and characteristics of the present invention will become more apparent from detailed description of the following best embodiments and accompanying drawings in connection with the embodiments.

In addition, in the present specification, besides the above description, other various technological features such as an ambient light sensor and the like that are capable of implementing a constant output to be obtained for a constant illumination are disclosed and proposed.

BRIEF DESCRIPTION OF THE DRAWINGS

FIG. 2 is a table showing pin numbers, terminal names, input/output equivalent circuits, and functions of external terminals.

FIG. 5 is a table showing electrical characteristics of the semiconductor apparatus 10.

FIG. 9 is a schematic view showing an arrangement example of photodiodes.

FIG. 15 is a logical-value table for mode settings using a GC1 terminal and a GC2 terminal.

DETAILED DESCRIPTION OF PREFERRED EMBODIMENTS

Figure 1:
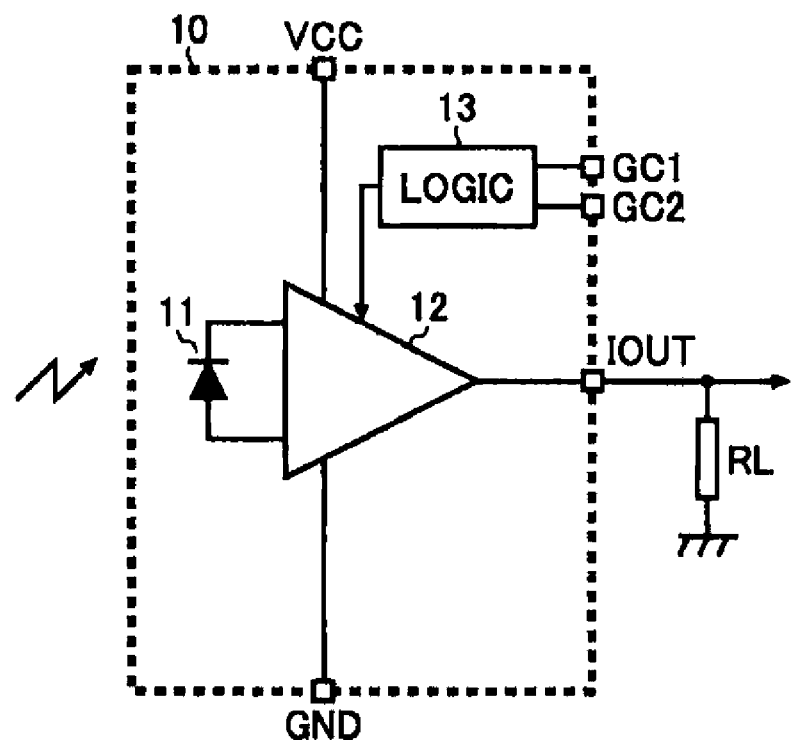
FIG. 1 is a block diagram showing an embodiment of a semiconductor apparatus according to the present invention.

FIG. 1 is a block diagram showing an embodiment of a semiconductor apparatus according to the present invention.

An overview of a semiconductor apparatus 10 according to the present embodiment is described below.

The semiconductor apparatus 10 shown in FIG. 1 is an analog ambient light sensor IC that outputs an electric current, and, for example, is capable of outputting illumination data for implementation of brightness adjustment of a liquid crystal display screen. Besides, it is possible to decrease power consumption of a set and improve visibility of a screen by adjusting brightness of a liquid crystal display and a key pad according to illumination data.

Next, features of the semiconductor apparatus 10 are described.

A first feature is that a small surface mount package (3.0 [mm]×1.6 [mm]) is used. A second feature is that the semiconductor apparatus 10 has a spectral sensitivity characteristic near visual sensitivity (the peak sensitivity wavelength: 560 [nm] (typ.)). A third feature is that an electric current proportionate to an illumination is output. A fourth feature is that the semiconductor apparatus 10 can operate in a wide driving voltage range of 2.4 to 5.5 [V]. A fifth feature is that a shutdown function is incorporated. A sixth feature is that the current output gain can be controlled by 3 steps. A seventh feature is that the semiconductor apparatus 10 is compatible with a 1.8 [V] logic input interface. A eighth feature is that sensitivity fluctuation is small (±15%).

The semiconductor apparatus 10 is incorporated in electronic apparatuses such as a mobile phone, a liquid crystal display television, a plasma television, a notebook computer, a mobile game machine, a digital still camera, a digital camcorder, a car navigation apparatus, a PDA (Personal Digital/Data Assistant) and the like, and can be preferably used as a means for detecting ambient illumination.

As shown in FIG. 1, the semiconductor apparatus 10 according to the present embodiment that has the features described above includes a light receiving portion 11, a current amplification portion 12, and a logic portion 13 that are integrated.

The light receiving portion 11 is a light receiving means that presents a spectral sensitivity characteristic near visual sensitivity, and includes a plurality of photodiodes in the present embodiment.

The current amplification portion 12 is a means that amplifies a light current obtained by the light receiving portion 11 to generate an output signal, and can change the gain by 3 steps (H/M/L).

The logic portion 13 is a logic circuit that sets an operation mode (shutdown mode/H gain mode/M gain mode/gain mode) of the apparatus according to input voltages to a GC1 terminal and a GC2 terminal.

Besides, the semiconductor apparatus 10 according to the present embodiment includes 6 outer terminals (first to sixth pins) as means for electric connection to external apparatuses.

FIG. 2 is a table showing pin numbers, terminal names, input/output equivalent circuits, and functions of the outer terminals.

An IOUT terminal (the first pin) is a terminal via which a detected current depending on an illumination is output, and is connected to a GND terminal via an external resistor RL for use (see FIG. 1). Electrostatic protective diodes are each connected across the IOUT terminal and the VCC terminal (the third pin), and across the IOUT terminal and the GND terminal (the second pin).

The GND terminal (the second pin) is a ground terminal.

The VCC terminal (the third pin) is a power-supply voltage terminal.

The NC terminal (the fourth pin) is a non-connect terminal that is not used in a usual time, and it is desirable that the NC terminal is opened or short-circuited to the GND terminal in a usual time.

The GC1 terminal (the fifth pin) and the GC2 terminal (the sixth pin) are mode setting terminals that are compatible with a 1.8 [V] logic interface, and an electrostatic protective resistor is connected in a signal circuit of each mode setting terminal. Besides, electrostatic protective diodes are each connected across the GC1 terminal and the VCC terminal, the GC2 terminal and the VCC terminal, the GC1 terminal and the GND terminal, and the GC2 terminal and the GND terminal.

Figure 3:
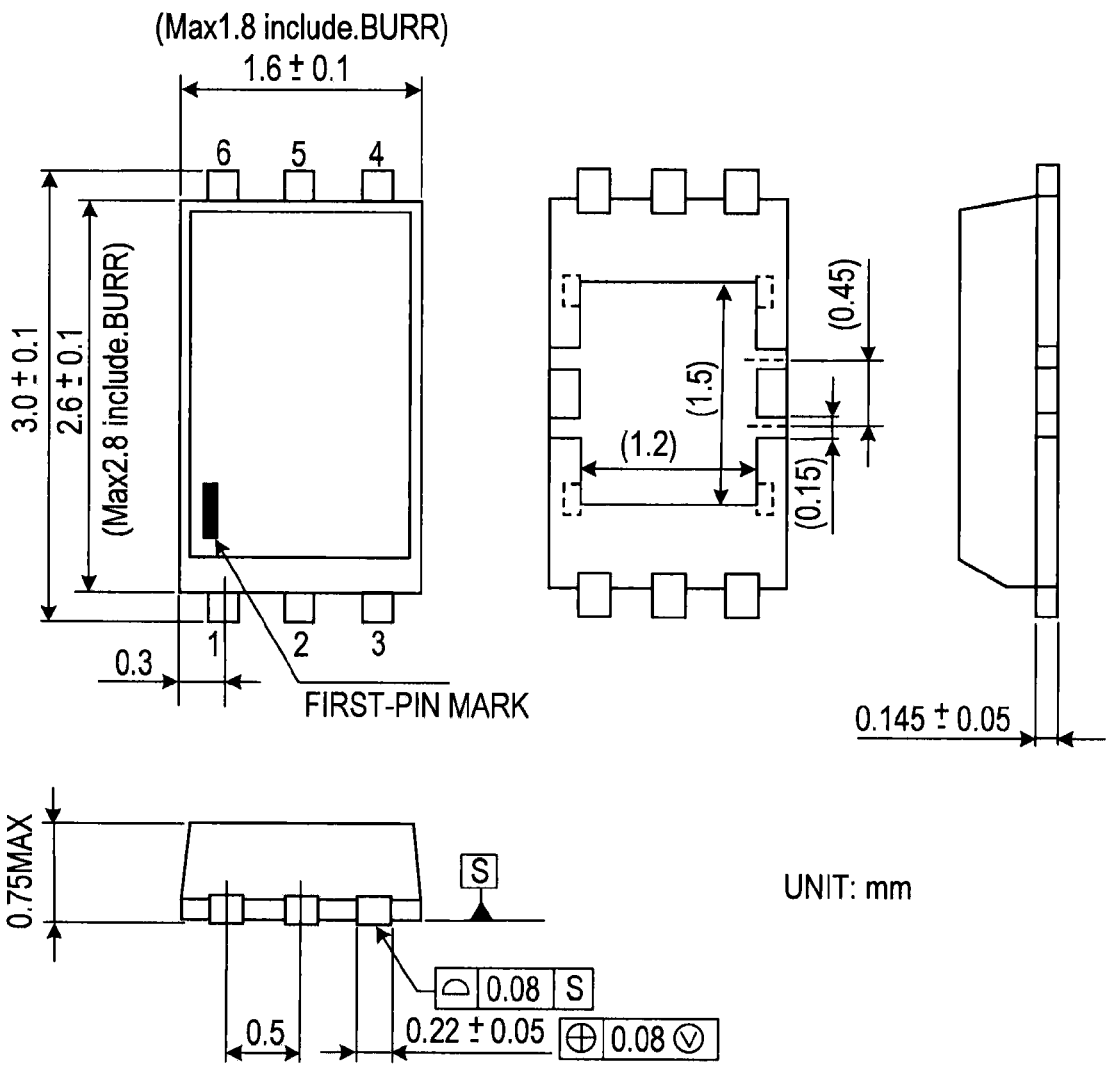
FIG. 3 is a dimensional view of a semiconductor apparatus 10.
Figure 4:
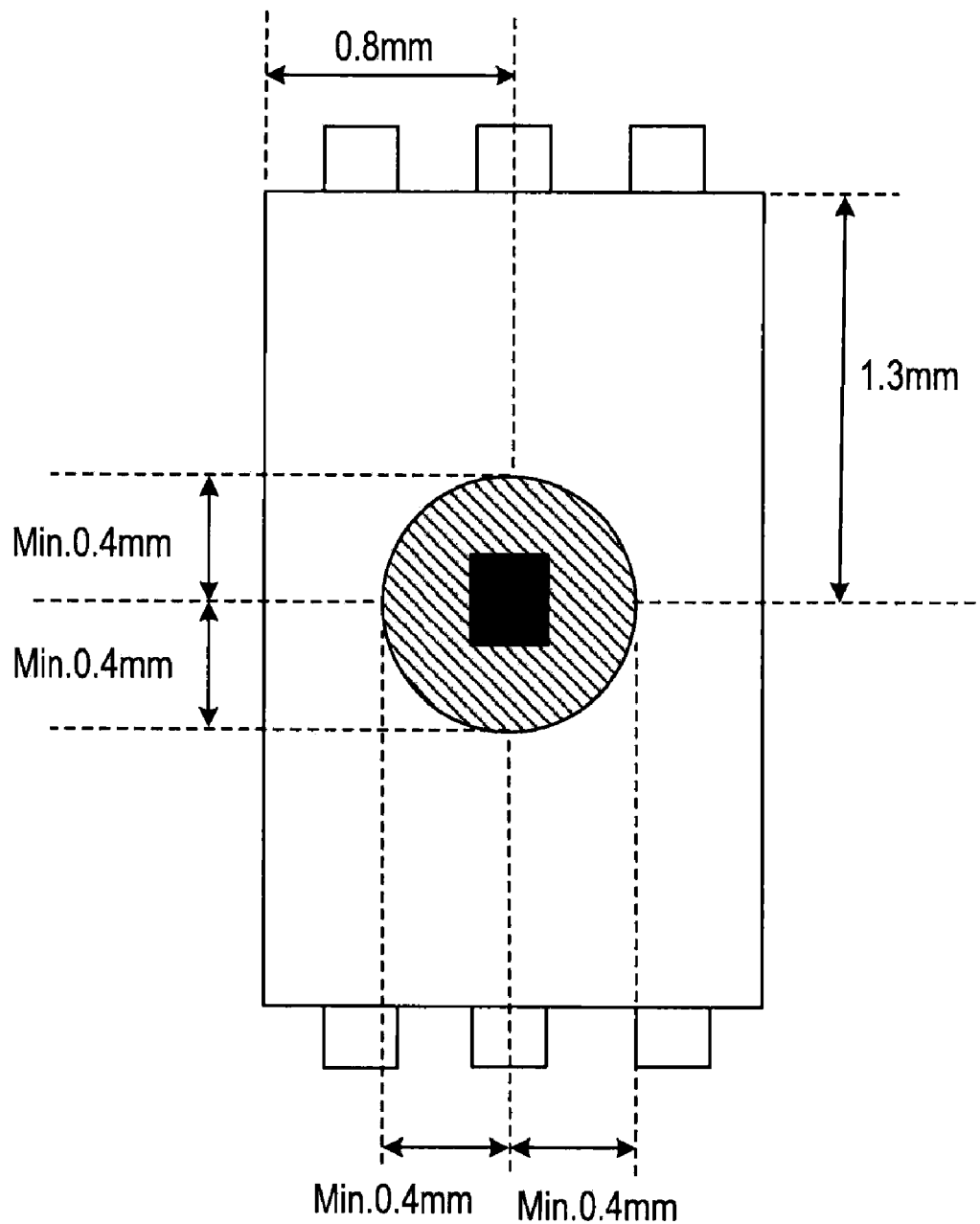
FIG. 4 is a view for description of optical design of a package upper surface.

The semiconductor apparatus 10 is encapsulated in a small surface mount package (3.0 [mm]×1.6 [mm]) shown in FIG. 3. As for optical design of the upper surface of the package, as shown in FIG. 4, a light receiving area X (0.25 [mm]×0.3 [mm]) is formed on the central portion of the package upper surface. Accordingly, it is desirable that set design is so performed as to allow light to hit at least an area indicated by a circular portion Y shown in FIG. 4.

FIG. 5 is a table that shows electric characteristics of the semiconductor apparatus 10 having the structure described above. The electric characteristics shown in FIG. 5 present numerical values under a condition of VCC=3 [V], and an ambient temperature Ta=25 [° C.] unless otherwise specified.

Next, a structure and operation of the light receiving portion 11 are described in detail.

Figure 6:
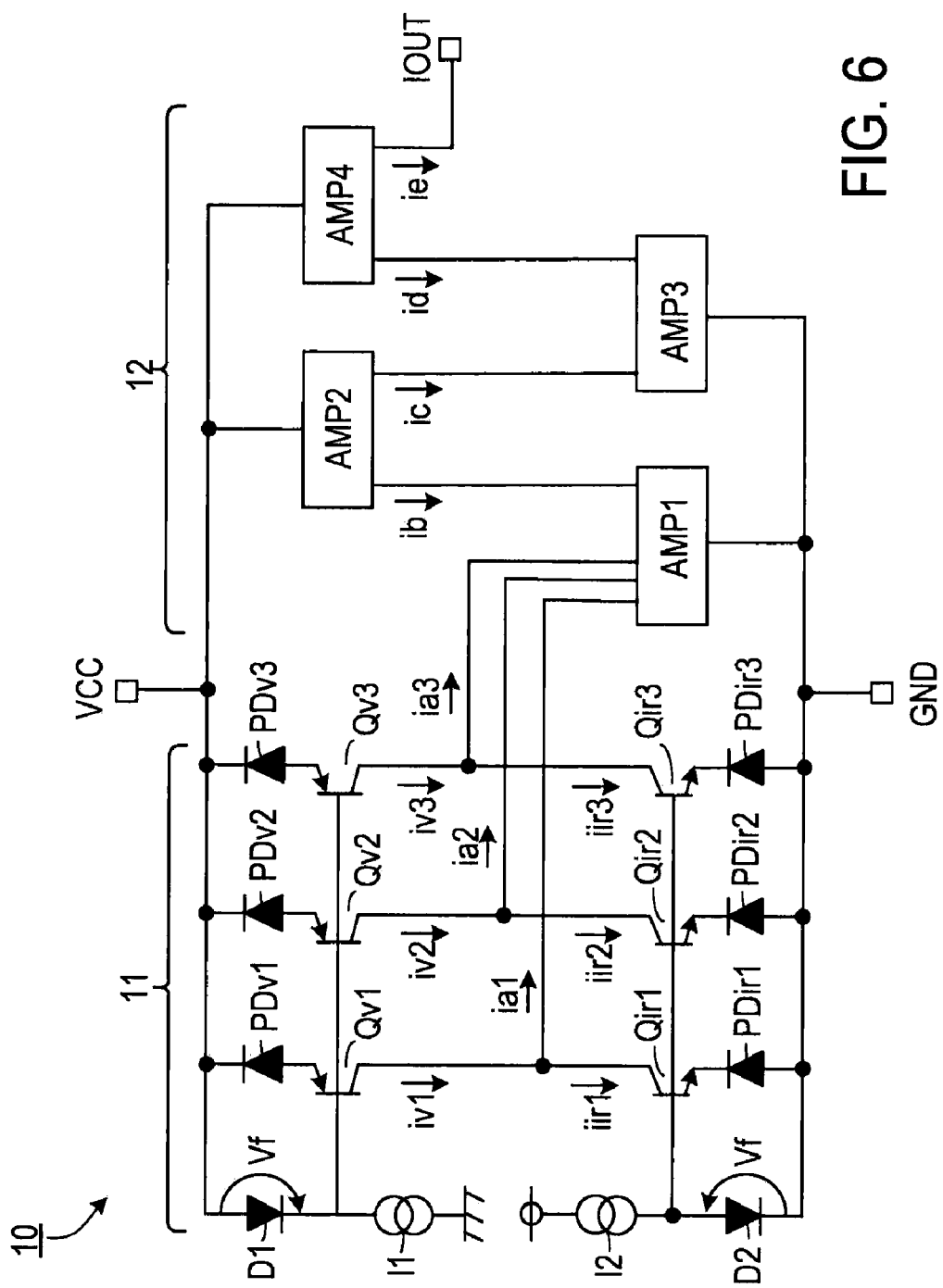
FIG. 6 is a circuit diagram showing a structural example of a light receiving portion 11.

FIG. 6 is a circuit diagram showing a structural example of the light receiving portion 11.

As shown in FIG. 6, the light receiving portion 11 includes photodiodes PDv1, PDv2, and PDv3, photodiodes PDir1, PDir2, and PDir3, diodes D1, D2, and constant-current sources I1, I2.

All the cathodes of the photodiodes PDv1, PDv2, and PDv3 are connected to the application terminal of the power-supply voltage VCC. The anodes of the photodiodes PDv1, PDv2, and PDv3 are connected to the emitters of transistors Qv1, Qv2, and Qv3, respectively. The collectors of the transistors Qv1, Qv2, and Qv3 are connected to the collectors of transistors Qir1, Qir2, and Qir3, respectively. The emitters of the transistors Qir1, Qir2, and Qir3 are connected to the cathodes of the photodiodes PDir1, PDir2, and PDir3, respectively. All the anodes of the photodiodes PDir1, PDir2, and PDir3 are connected to a ground terminal. The anode of the diode D1 is connected to the application terminal of the power-supply voltage VCC. The cathode of the diode D1 is connected to the bases of the transistors Qv1, Qv2, and Qv3, and is also connected to the ground terminal via the constant-current source I1. The cathode of the diode D2 is connected to the ground terminal. The anode of the diode D2 is connected to the bases of the transistors Qir1, Qir2, and Qir3, and is also connected to the application terminal of the power-supply voltage VCC via the constant-current source I2.

Each of the photodiodes PDv1, PDv2, and PDv3 includes a PN junction that is composed of a P-type impurity diffusion layer (L/I layer) and an N-type impurity diffusion layer (B/L layer) formed on the lower surface of the L/I layer, and is so designed as to have the peak sensitivity wavelength λ p1 of about 600 [nm]. As described above, because the PN junction is formed in a shallow region of the semiconductor chip, it is possible to form a photoelectric transducing device that has the peak sensitivity wavelength λ p1 in a visible-light region.

Figure 7:
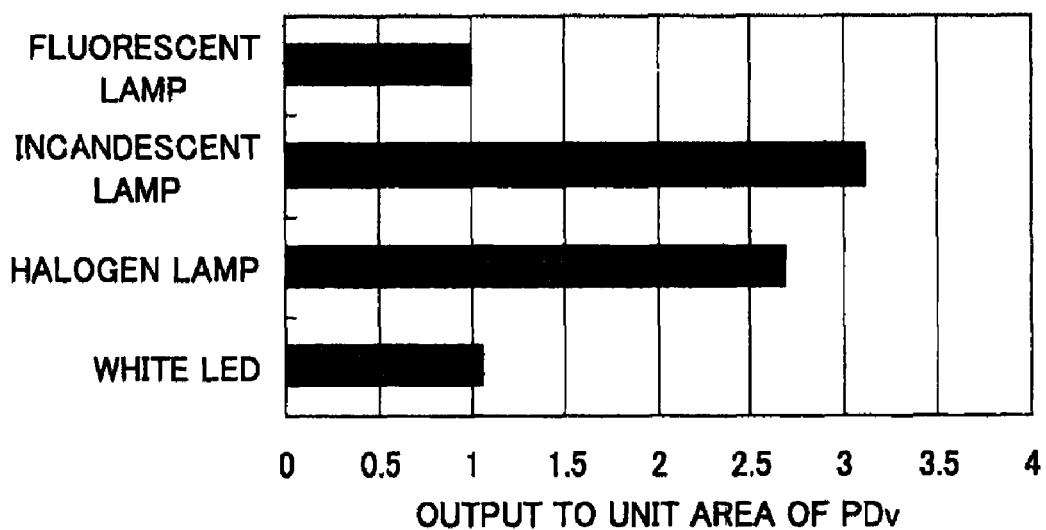
FIG. 7 is a view showing largeness of a light current generated by a unit area of a visible light detection photodiode PDv.

FIG. 7 is a view showing largeness of a light current generated by a unit area of a visible light detection photodiode PDv, and in order from the top, current values (ratios of the current values to the light current assumed 1 that is obtained by a unit area of the visible light detection photodiode PDv when a fluorescent lamp is used as the light source) which are respectively obtained when a fluorescent lamp, an incandescent lamp, a halogen lamp, and a white LED is used as the light source are shown.

On the other hand, each of the photodiodes PDir1, PDir2, and PDir3 includes a PN junction that is composed of an N-type impurity diffusion layer (B/L layer) and an P-type substrate (Psub), and is so designed as to have the peak sensitivity wavelength λ p2 of about 860 [nm]. As described above, because the PN junction is formed in a deep region of the semiconductor chip, it is possible to form a photoelectric transducing device that has the peak sensitivity wavelength λ p2 in an infrared-light region.

Figure 8:
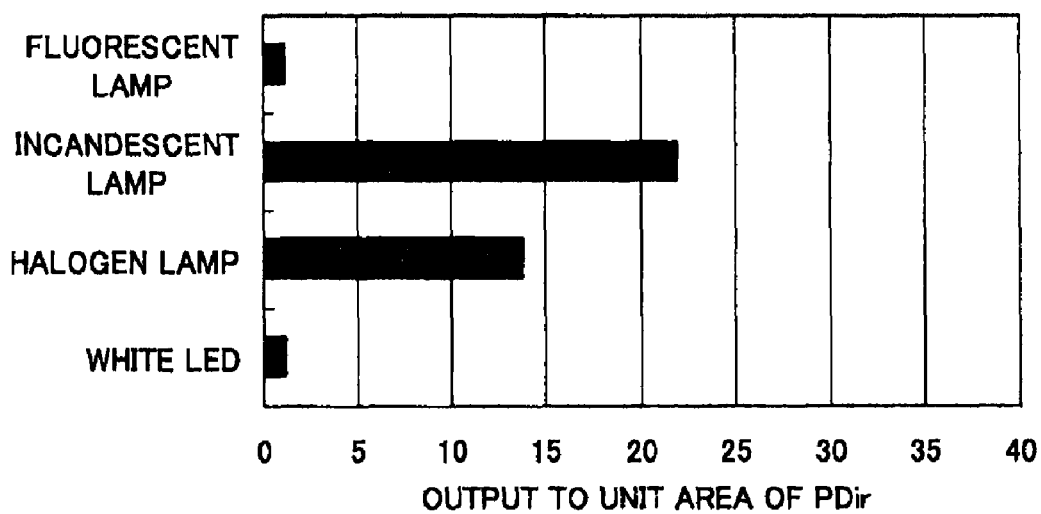
FIG. 8 is a view showing largeness of a light current generated by a unit area of an infrared light detection photodiode PDir.

FIG. 8 is a view showing largeness of a light current generated by a unit area of an infrared light detection photodiode PDir, and in order from the top, current values (ratios of the current values to the light current assumed 1 that is obtained by a unit area of the visible light detection photodiode PDv when a fluorescent lamp is used as the light source) which are respectively obtained when a fluorescent lamp, an incandescent lamp, a halogen lamp, and a white LED is used as the light source are shown.

In the light receiving portion 11 having the structure described above, a difference current ia1 that is obtained by subtracting a light current iir1 generated by the photodiode PDir1 from a light current iv1 generated by the photodiode PDv1 is drawn from the connection node where the collector of the transistor Qv1 and the collector of the transistor Qir1 are connected to each other.

In other words, in the light receiving portion 11 having the structure described above, the visible-light detection photodiode PDv1 and the infrared-light detection photodiode PDir1 are connected with each other in series, thereby a first light receiving unit, which calculates differences between the light currents iv1, iir1 which are respectively generated by the photodiodes PDv1, PDir1, is formed.

As shown in FIG. 9, the photodiodes PDv1 and PDir1 are so arranged on the chip upper surface that the light-receiving area proportion between them becomes a first proportion (in the example shown in FIG. 9, PDv1:PDir1=25.6:11.7).

Figure 10:
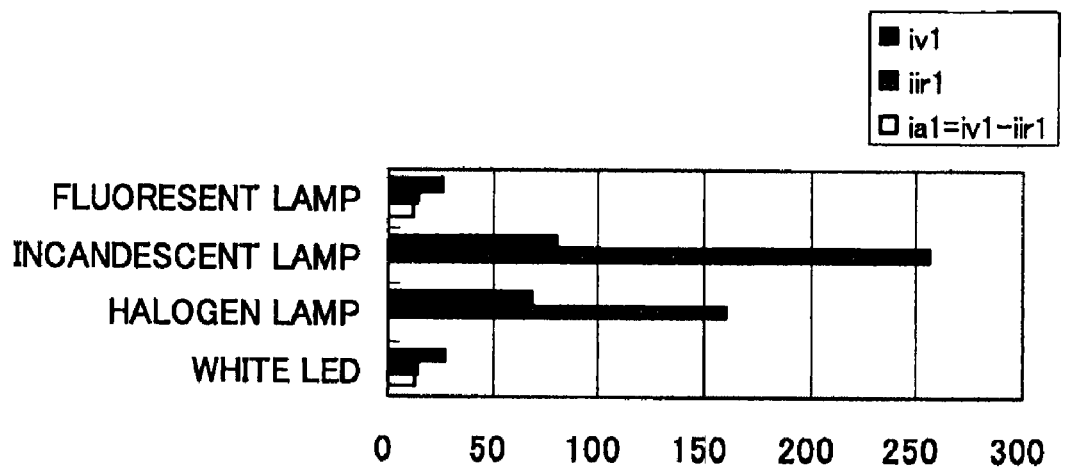
FIG. 10 is a view showing largeness of each of a light current iv1, a light current iir1, and a difference current ia1.

FIG. 10 is a view showing largeness of each of the light current iv1, the light current iir1, and the difference current ia1, and in order from the top, current values (ratios of the current values to the light current assumed 1 that is obtained by a unit area of the visible-light detection photodiode PDv when a fluorescent lamp is used as the light source) which are respectively obtained when a fluorescent lamp, an incandescent lamp, a halogen lamp, and a white LED is used as the light source are shown.

In the light receiving portion 11 having the structure described above, a difference current ia2 that is obtained by subtracting a light current iir2 generated by the photodiode PDir2 from a light current iv2 generated by the photodiode PDv2 is drawn from the connection node where the collector of the transistor Qv2 and the collector of the transistor Qir2 are connected to each other.

In other words, in the light receiving portion 11 having the structure described above, the visible-light detection photodiode PDv2 and the infrared-light detection photodiode PDir2 are connected with each other in series, thereby a second light receiving unit, which calculates differences between the light currents iv2, iir2 which are respectively generated by the photodiodes PDv2, PDir2, is formed.

As shown in FIG. 9, the photodiodes PDv2 and PDir2 are so arranged on the chip upper surface that the light-receiving area proportion between them becomes a second proportion (in the example shown in FIG. 9, PDv2:PDir2=25.6:4.5). Thus, in the second light receiving unit, the subtraction proportion at the time of subtracting the infrared-light amount from the visible-light amount is reduced compared with that in the first light receiving unit.

Figure 11:
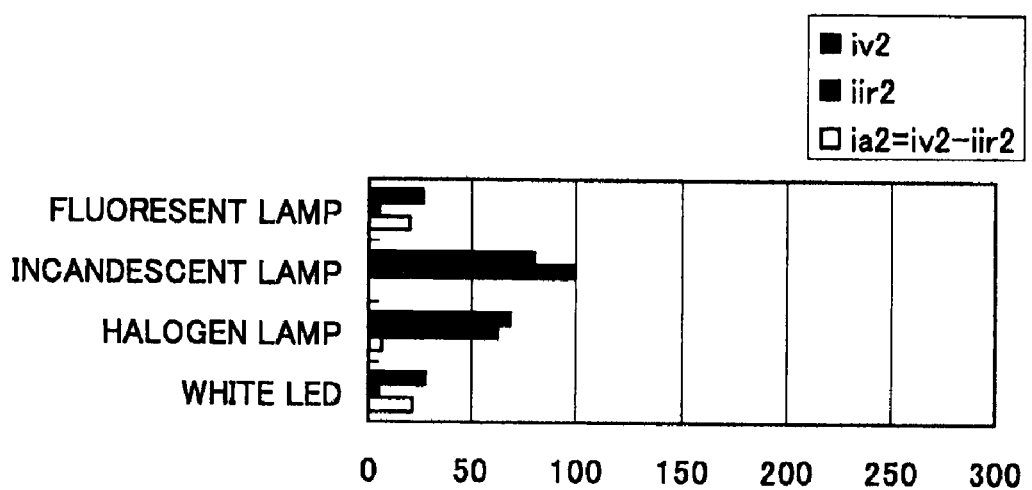
FIG. 11 is a view showing largeness of each of a light current iv2, a light current iir2, and a difference current ia2.

FIG. 11 is a view showing largeness of each of the light currents iv2, iir2, and the difference current ia2, and in order from the top, current values (ratios of the current values to the light current assumed 1 that is obtained by a unit area of the visible-light detection photodiode PDv when a fluorescent lamp is used as the light source) which are respectively obtained when a fluorescent lamp, an incandescent lamp, a halogen lamp, and a white LED is used as the light source are shown.

In the light receiving portion 11 having the structure described above, a difference current ia3 that is obtained by subtracting a light current iir3 generated by the photodiode PDir3 from a light current iv3 generated by the photodiode PDv3 is drawn from the connection node where the collector of the transistor Qv3 and the collector of the transistor Qir3 are connected to each other.

In other words, in the light receiving portion 11 having the structure described above, the visible-light detection photodiode PDv3 and the infrared-light detection photodiode PDir3 are connected with each other in series, thereby a third light receiving unit, which calculates differences between the light currents iv3, iir3 which are respectively generated by the photodiodes PDv3, PDir3, is formed.

As shown in FIG. 9, the photodiodes PDv3 and PDir3 are so arranged on the chip upper surface that the light-receiving area proportion between them becomes a third proportion (in the example shown in FIG. 9, PDv3:PDir3=30.5:1.7). Thus, in the third light receiving unit, the subtraction proportion at the time of subtracting the infrared-light amount from the visible-light amount is reduced compared with that in the first light receiving unit.

Figure 12:
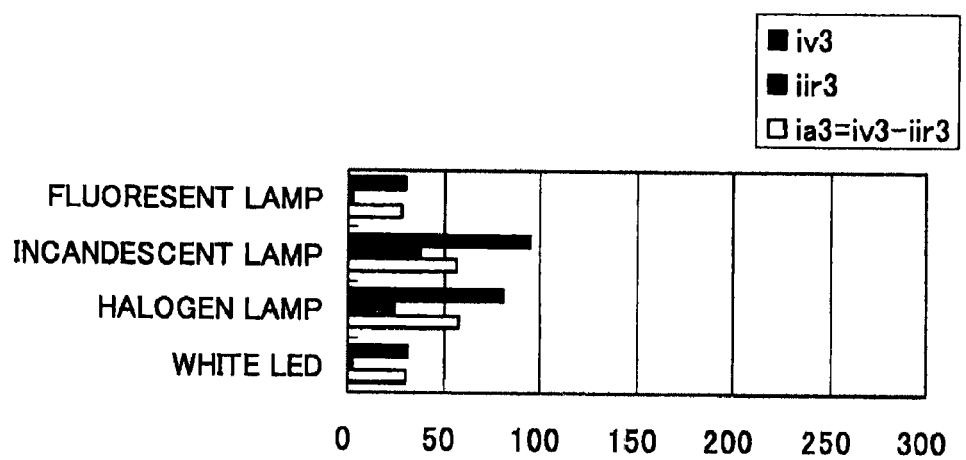
FIG. 12 is a view showing largeness of each of a light current iv3, a light current iir3, and a difference current ia3.

FIG. 12 is a view showing largeness of each of the light current iv3, the light current iir3, and the difference current ia3, and in order from the top, current values (ratios of the current values to the light current assumed 1 that is obtained by a unit area of the visible-light detection photodiode PDv when a fluorescent lamp is used as the light source) which are respectively obtained when a fluorescent lamp, an incandescent lamp, a halogen lamp, and a white LED is used as the light source are shown.

The difference currents ia1, ia2, and ia3 are totaled and amplified by the next-stage current amplification portion 12, and the total current is output as a detected current depending on brightness of the light source via the IOUT terminal.

As described above, the semiconductor apparatus 10 has the structure in which the semiconductor apparatus 10 includes a plurality of the light receiving units that calculate differences between the light currents iv1, iv2, and iv3 which are respectively generated by the visible-light detection photodiodes PDv1, PDv2, and PDv3, and the light currents iir1, iir2, and iir3 which are respectively generated by the infrared-light detection photodiodes PDir1, PDir2, and PDir3, all the difference calculation results (difference currents ia1, ia2, and ia3) are totaled to generate an output signal, and the plurality of light receiving units calculate differences between the light currents according to different subtraction proportions.

According to this structure, for example, if a halogen lamp that emits light which contains much infrared light is used as the light source, in the first light receiving unit, the difference calculation result obtained by subtracting an infrared-light amount from a visible-light amount becomes below zero, accordingly, the difference current ia1 becomes zero. However, in the second and third light receiving units in which the subtraction proportions are smaller than that of the first light receiving unit, the difference calculation result does not become below zero, accordingly, the difference currents ia2 and ia3 each having a positive current value are output. If an incandescent lamp that emits light which contains more infrared light than a halogen lamp is used as the light source, the difference current ia2 obtained by the second light receiving unit also becomes zero. However, in the third light receiving unit which has the smallest subtraction proportion, the difference calculation result does not become below zero, accordingly, the difference current ia3 having a positive current value is output. On the other hand, if a fluorescent lamp and a white LED that do not contain so much infrared light is used as the light source, all the difference calculation results obtained by the first to third light receiving units become positive, and all the difference currents ia1, ia2, and ia3 each having a positive current value are output.

In other words, in connection with the total current (ia1+ia2+2ia3) of the difference currents ia1 to ia3, the semiconductor apparatus 10 according to the present embodiment operates automatically changing the subtraction proportions of infrared light according to the kind of the light source.

Accordingly, in the semiconductor apparatus 10 according to the present embodiment, it is possible to carry out a constant output for a constant illumination irrespective of the kind of the light source by suitably adjusting the difference calculation proportions of the first to third light receiving units (in the present embodiment as an example, the light receiving area proportions between the photodiodes PDv1 to PDv3 and the photodiodes PDir1 to PDir3).

Figure 13:
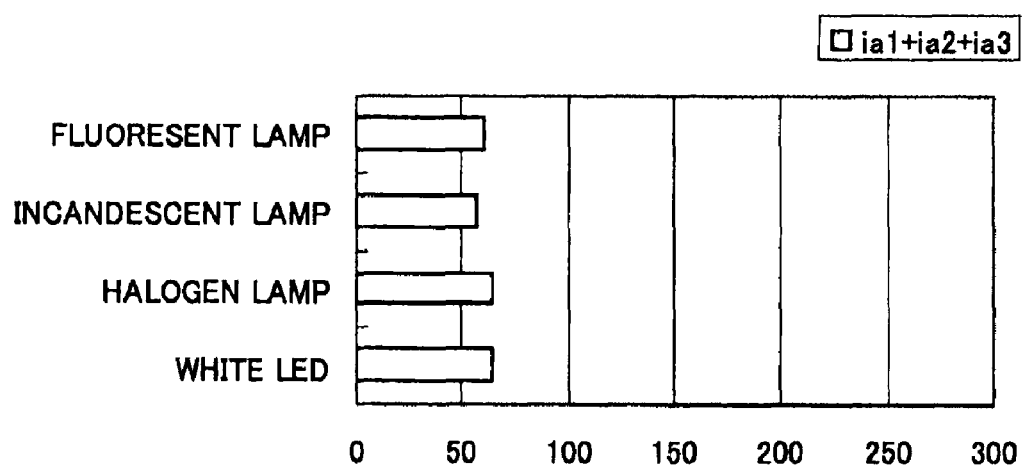
FIG. 13 is a view showing total values of the difference currents ia1, ia2, and ia3.

FIG. 13 is a view showing largeness of each of total currents (ia1+ia2+ia3) of the difference currents ia1, ia2, and ia3, and in order from the top, current values (ratios of the current values to the light current assumed 1 that is obtained by a unit area of the visible-light detection photodiode PDv when a fluorescent lamp is used as the light source) which are respectively obtained when a fluorescent lamp, an incandescent lamp, a halogen lamp, and a white LED is used as the light source are shown.

As shown in FIG. 13, in the semiconductor apparatus 10 according to the present embodiment, a constant output is carried out for a constant illumination irrespective of the light source.

In the semiconductor apparatus 10 according to the present embodiment, the photodiodes PDv1 to PDv3 and the photodiodes PDir1 to PDir3 have light receiving area proportions different from each other among the first to third light receiving units. According to this structure, it is possible to easily adjust the difference calculation proportions in the first to third light receiving units.

Besides, in the semiconductor apparatus 10 according to the present embodiment, the photodiodes PDv1 to PDv3 and the photodiodes PDir1 to PDir3 are so arranged on the chip upper surface that the first to third light receiving units have the same optical characteristic (directivity and the like)(see FIG. 9 described above). Especially, some photodiodes (in the example shown in FIG. 9, the photodiodes PDv1, PDir1, PDv2, and PDv3 that have a large area proportion) are so arranged separately at different places on the chip upper surface that the first to third light receiving units have the same optical characteristic (directivity and the like). According to this structure, even if light is directed from any directions to the semiconductor apparatus 10, it is possible to perform exact measurement of illuminations.

In addition, in the semiconductor apparatus 10 according to the present embodiment, the light receiving portion 11 includes a first bias circuit (the diode D1, the transistors Qv1 to Qv3, and the constant-current source I1) which keeps the potential differences across both terminals of the photodiodes PDv1 to PDv3 at constant values, and a second bias circuit (the diode D2, the transistors Qir1 to Qir3, and the constant-current source 12) which keeps the potential differences across both terminals of the photodiodes PDir1 to PDir3 at constant values. According to this structure, it is possible to keep the potential differences across both terminals of the photodiodes PDv1 to PDv3, and the potential differences across both terminals of the photodiodes PDir1 to PDir3 at values of almost zero (the difference values between the forward drop voltage of the diode D1 (D2) and the base-emitter voltages of the transistors Qv1 to Qv3 (Qir1 to Qir3)). Accordingly, even if the temperature of the semiconductor apparatus 10 becomes high, it becomes possible to reduce leak currents of the photodiodes PDv1 to PDv3, and of the photodiodes PDir1 to PDir3.

Next, a structure and operation of the current amplification portion 12 are described in detail.

Figure 14:
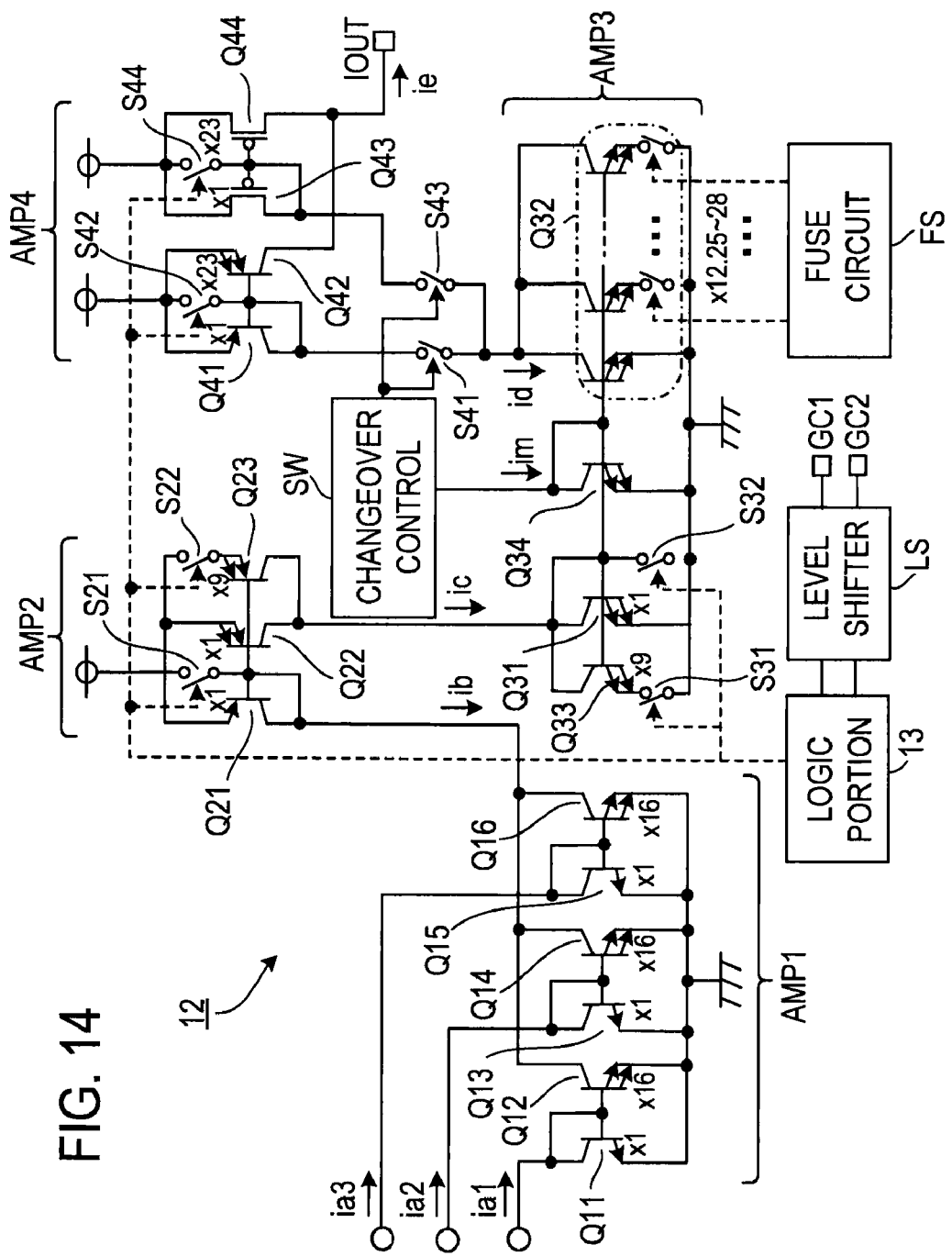
FIG. 14 is a circuit diagram showing a structural example of a current amplification portion 12.

FIG. 14 is a circuit diagram showing a structural example of the current amplification portion 12.

As shown in FIG. 14, the current amplification portion 12 includes current amplification stages AMP1 to AMP4.

The current amplification stage AMP1 is a means that amplifies the difference currents ia1, ia2, and ia3 which are input from the light receiving portion 11, totals the amplified currents to generate an amplified current ib, and includes npn-type bipolar transistors Q11 to Q16.

The collector of the transistor Q11 is connected to the input terminal for the difference current ia1. All the bases of the transistors Q11, Q12 are connected to the collector of the transistor Q11. All the emitters of the transistors Q11, Q12 are connected to a ground terminal. The emitter-area proportion between the transistors Q11 and Q12 is set to 1:16. In other words, the transistors Q11 and Q12 compose a current mirror amplifier that amplifies the difference current ia1 to a 16-fold current and outputs the amplified current.

The collector of the transistor Q13 is connected to the input terminal for the difference current ia2. All the bases of the transistors Q13, Q14 are connected to the collector of the transistor Q13. All the emitters of the transistors Q13, Q14 are connected to a ground terminal. The emitter-area proportion between the transistors Q13 and Q14 is set to 1:16. In other words, the transistors Q13 and Q14 compose a current mirror amplifier that amplifies the difference current ia2 to a 16-current and outputs the amplified current.

The collector of the transistor Q15 is connected to the input terminal for the difference current ia3. All the bases of the transistors Q15, Q16 are connected to the collector of the transistor Q15. All the emitters of the transistors Q15, Q16 are connected to a ground terminal. The emitter-area proportion between the transistors Q15 and Q16 is set to 1:16. In other words, the transistors Q15 and Q16 compose a current mirror amplifier that amplifies the difference current ia3 to a 16-current and outputs the amplified current.

All the collectors of the transistors Q12, Q14, and Q16 are connected to an output terminal for the amplified current ib. Accordingly, the amplified current ib equals the total value (=(ia1+ia2+ia3)×16) of the mirror currents that are obtained by the current mirror amplifiers.

The current amplification stage AMP2 is a means that further amplifies the amplified current ib input from the current amplification stage AMP1 to generate an amplified current ic, and includes pnp-type bipolar transistors Q21 to Q23 and switches S21, S22.

The collector of the transistor Q21 is connected to the input terminal (the output terminal of the current amplification stage AMP1) for the amplified current ib. All the emitters of the transistors Q21, Q22 are connected to a power-supply line. The emitter of the transistor Q23 is connected to the power-supply line via the switch S22. All the bases of the transistors Q21, Q22, and Q23 are connected to the collector of the transistor Q21, and are also connected to the power-supply line via the switch S21. All the collectors of the transistor Q22, Q23 are connected to an output terminal for the amplified current ic. The emitter-area proportion among the transistors Q21, Q22, and Q23 is set to 11:1:9. In other words, the transistors Q21, Q22, and Q23 compose a current mirror amplifier that amplifies the amplified current ib to a 1-fold or a 10-fold current and outputs the amplified current.

The current amplification stage AMP3 is a means that further amplifies the amplified current ic input from the current amplification stage AMP2 to generate an amplified current id, and includes npn-type bipolar transistors Q31 to Q34 and switches S31, S32.

The collectors of the transistors Q31, Q33 are connected to the input terminal (the output terminal of the current amplification stage AMP2) for the amplified current ic. All the emitters of the transistors Q31, Q32 are connected to a aground terminal. The emitter of the transistor Q33 is connected to the ground terminal via the switch S31. All the bases of the transistors Q31, Q32, and Q33 are connected to the collector of the transistor Q31, and are also connected to the ground terminal via the switch S32. The collector of the transistor Q32 is connected to an output terminal for the amplified current id. The collector of the transistor Q34 is connected to an amplified-current detection terminal of a changeover control circuit SW. The emitter of the transistor Q34 is connected to the ground terminal. The base of the transistor Q34 is connected to the base of the transistor Q31, and is also connected to the collector of the transistor Q34. The emitter-area proportion among the transistors Q33, Q31, and Q32 is set to 9:1:α (where α=12.25 to 28, and is set to 17.5 as a default). In other words, the transistors Q31, Q32, and Q33 compose a current mirror amplifier that amplifies the amplified current ic to an α-fold or α/10-fold current and outputs the amplified current.

The current amplification stage AMP4 is a means that further amplifies the amplified current id input from the current amplification stage AMP3 to generate an amplified current ie, and includes pnp-type bipolar transistors Q41, Q42, P channel-type MOS Field Effect Transistors Q43, Q44, and switches S41 to S44.

The collector of the transistor Q41 is connected to the input terminal (the output terminal of the current amplification stage AMP3) for the amplified current id via the switch S41. All the emitters of the transistors Q41, Q42 are connected to a power-supply line. All the bases of the transistors Q41, Q42 are connected to the collector of the transistor Q41, and are also connected to the power-supply line via the switch S42. The emitter-area proportion between the transistors Q41, Q42 is set to 1:23. In other words, the transistors Q41, Q42 compose a first current mirror amplifier that amplifies the amplified current id to a 23-fold current and outputs the amplified current.

The drain of the transistor Q43 is connected to the input terminal (the output terminal of the current amplification stage AMP3) for the amplified current id via the switch S43. All the sources of the transistors Q43, Q44 are connected to a power-supply line. All the gates of the transistors Q43, Q44 are connected to the drain of the transistor Q43, and are also connected to the power-supply line via the switch S44. The source-area proportion between the transistors Q43, Q44 is set to 1:23. In other words, the transistors Q43, Q44 compose a second current mirror amplifier that amplifies the amplified current id to a 23-fold current and outputs the amplified current.

Both the collector of the transistor Q42 and the drain of the transistor Q44 are connected to the IOUT terminal. Accordingly, the detected current (the amplified current ie) from the semiconductor apparatus 10 equals the total value of the mirror currents that are obtained by the first and second current mirror amplifiers described above.

Next, gain changeover of the current amplification stage 12 having the above structure is described in detail.

A logic portion 13 has a variable-control function to change the operation mode of the current amplification stage 12 by 4 steps based on a 2-bit gain control signal that is input from the GC1 terminal and the GC2 terminal via a level shifter circuit LS.

FIG. 15 is a logical-value table for mode settings that use the GC1 terminal and the GC2 terminal.

If all the input voltages to the GC1 terminal and the GC2 terminal have a low level, the semiconductor apparatus 10 goes into a shutdown mode. In the shutdown mode, the switches S21, S32, S42, and S44 are turned on, and the gains of the current amplification stages AMP2 to AMP4 become zero, accordingly, the total gain of the current amplification stage 12 also becomes zero. Even in the shutdown mode, the gain of the current amplification stage AMP1 is fixed at 16 times. According to this structure, it becomes possible to shorten a startup time (wakeup time) from the shutdown mode. However, if priority is given to power consumption reduction during the time of shutdown mode, the gain of the current amplification stage AMP1 may be decreased.

If the input voltage at the GC2 terminal has the low level and the input voltage at the GC1 terminal has the high level, the semiconductor apparatus 10 goes into a H gain mode. In the H gain mode, the switch S22 is turned on, and the gain of the current amplification stage AMP2 is set to 10 times. Besides, the switch S31 is turned off, and the gain of the current amplification AMP3 is set to 17.5 times (default). Accordingly, the total gain of the current amplification portion 12 becomes 64400 times.

If the input voltage at the GC2 terminal has the high level and the input voltage of the GC1 terminal has the low level, the semiconductor apparatus 10 goes into a M gain mode. In the M gain mode, the switch S22 is turned off, and the gain of the current amplification stage AMP2 is set to 1 time. Besides, the switch S31 is turned off, and the gain of the current amplification AMP3 is set to 17.5 times (default). Accordingly, the total gain of the current amplification portion 12 becomes 6440 times.

If both input voltages at the GC1 terminal and the GC2 terminal have the high level, the semiconductor apparatus 10 goes into a L gain mode. In the L gain mode, the switch S22 is turned off, and the gain of the current amplification stage AMP2 is set to 1 time. Besides, the switch S31 is turned on, and the gain of the current amplification AMP3 is set to 1.75 times (default). Accordingly, the total gain of the current amplification portion 12 becomes 644 times.

Thus, 3-step gain changeover control is carried out using the GC1 and GC2 terminals, thereby it becomes possible to perform a detection operation that is excellent in linearity in a wide input dynamic range of low illumination to high illumination.

Figure 16:
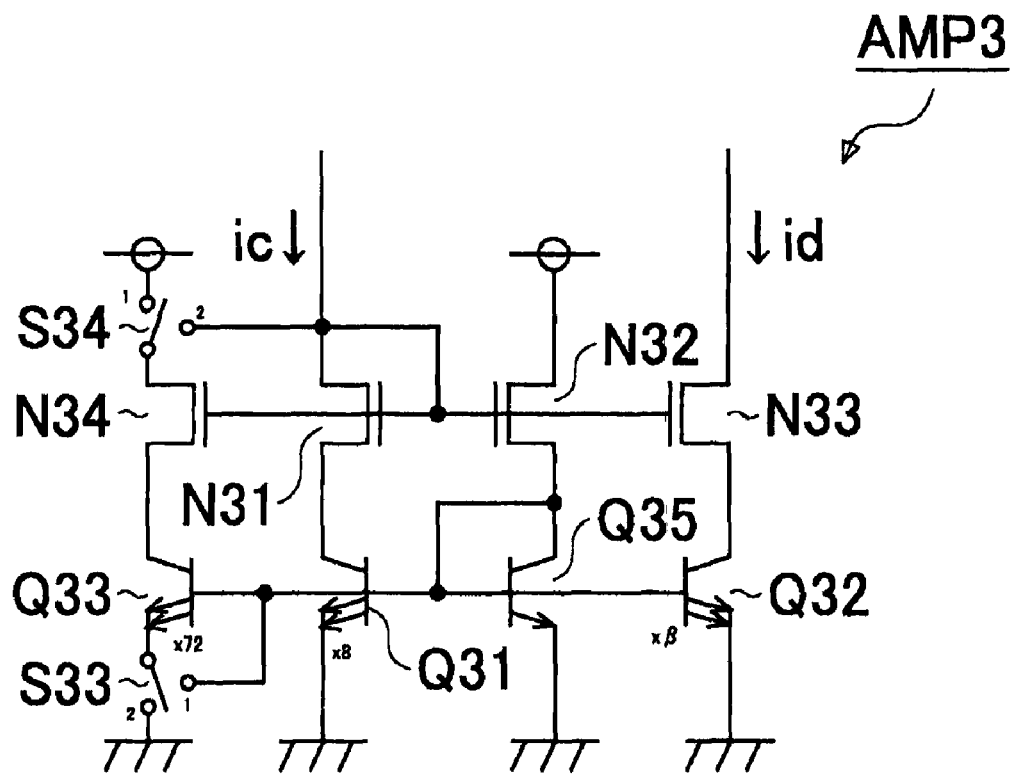
FIG. 16 is a circuit diagram showing a modification of a current amplification stage AMP 3.

FIG. 16 is a circuit diagram showing a modification of the current amplification AMP3.

The modified current amplification stage AMP3 includes the transistors Q31, Q32, and Q33 described above, an npn-type bipolar transistor Q35, N channel-type MOS Field Effect Transistors N31 to N34, and switches S33, S34.

All the emitters of the transistors Q31, Q32, and Q35 are connected to a ground terminal. The emitter of the transistor Q33 is connected to a common terminal of the switch S33. A first selection terminal of the switch S33 is connected to the base of the transistor Q33. A second selection terminal of the switch S33 is connected to the ground terminal. All the bases of the transistors Q31, Q32, Q33, and Q35 are connected to the collector of the transistor Q35. The collector of the transistor Q31 is connected to the source of the transistor N31. The collector of the transistor Q32 is connected to the source of the transistor N33. The collector of the transistor Q33 is connected to the source of the transistor N34. The collector of the transistor Q35 is connected to the source of the transistor N32. All the gates of the transistors N31 to N34 are connected to the drain of the transistor N31. The drain of the transistor N31 is connected to the input terminal for the amplified current ic. The drain of the transistor N32 is connected to a power-supply line. The drain of the transistor N33 is connected to the output terminal of the amplified current id. The drain of the transistor N34 is connected to a common terminal of the switch S34. A first selection terminal of the switch S34 is connected to a power-supply line. A second selection terminal of the switch S34 is connected to the drain of the transistor N31.

In the current amplification stage AMP3 having the above structure, if the semiconductor apparatus 10 is in the H gain mode or in the M gain mode described above, the common terminal of the switch S33 is connected to the first selection terminal, the common terminal of the switch S34 is connected to the first selection terminal, and the mirror ratio of the current mirror amplifier is set to 8:β (where β=98 to 224, and is set to 140 as a default). Here, the collector of the transistor Q33 is electrically disconnected from the current amplification stage AMP3. On the other hand, if the semiconductor apparatus 10 is in the L gain mode described above, the common terminal of the switch S33 is connected to the second selection terminal, the common terminal of the switch S34 is connected to the second selection terminal, and the mirror ratio of the current mirror amplifier is set to 80:β.

In this modified current amplification stage AMP3, because the current mirror amplifier is in a cascode connection, it is possible to reduce power-supply voltage dependency of the amplified current id.

Next, a structure and operation of the level shifter circuit LS are described in detail.

Figure 17:
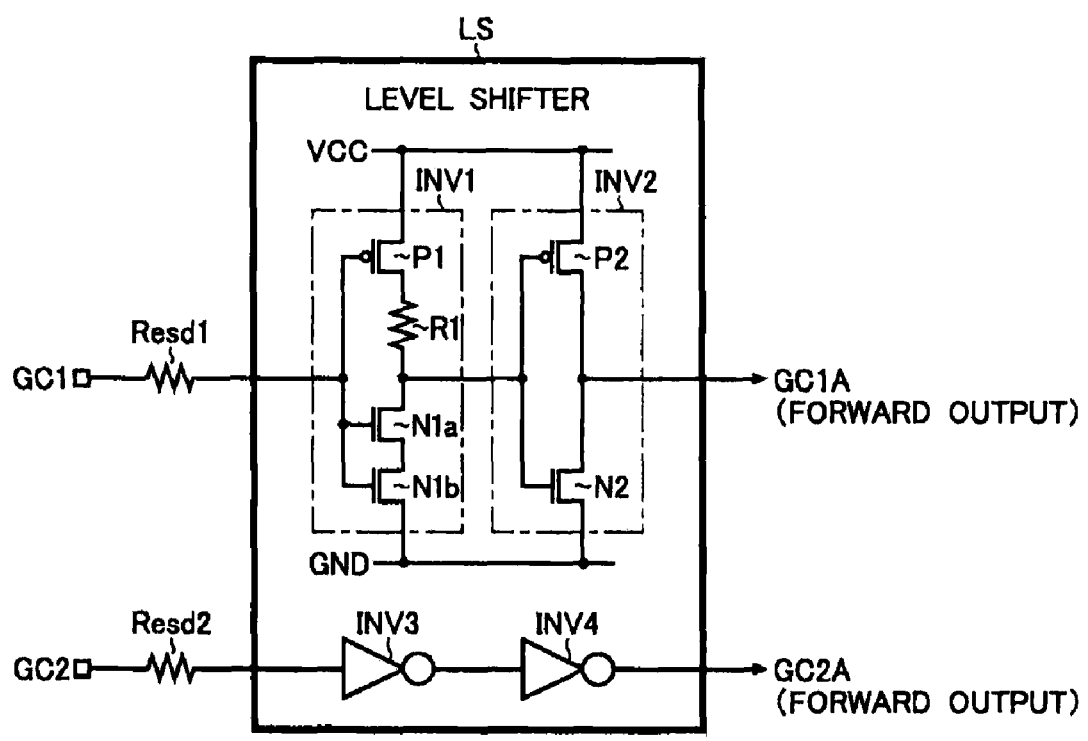
FIG. 17 is a circuit diagram showing a modification of a level shifter circuit LS.

FIG. 17 is a circuit diagram showing a structural example of the level shifter circuit LS.

As shown in FIG. 17, the level shifter circuit LS in this structural example is a means that carries out a level shift of a 2-bit gain control signal each bit of which is input to each of the GC1 terminal and the GC2 terminal, sends a forward output of each shifted signal to the logic portion 13, and includes inverters INV1 to INV4.

The inverter INV1 includes a P channel-type MOS Field Effect transistor P1, N channel-type MOS Field Effect transistors N1a, N1b, and a resistor R1. The inverter INV2 includes a P channel-type MOS Field Effect transistor P2, and an N channel-type MOS Field Effect transistor N2.

The source of the transistor P1 is connected to a power-supply line. The drain of the transistor P1 is connected to the drain of the transistor N1a via the resistor R1. The source of the transistor N1a is connected to the drain of the transistor N1b. The source of the transistor N1b is connected to a ground line. All the gates of the transistors P1, N1a, and N1b are connected to the GC1 terminal via an electrostatic protective resistor Resd1. The source of the transistor P2 is connected to the power-supply line. All the gates of the transistors P2, N2 are connected to the drain of the transistor N1a. All the drains of the transistors P2, N2 are connected to a signal input terminal of the logic portion 13 (not shown) as a forward output terminal GC1A for the gain control signal.

Accordingly, a gain control signal that is input from the GC1 terminal via the electrostatic protective resistor Resd1 is shifted in level by the inverters INV1, INV2, and output from the forward terminal GC1A to the logic portion 13.

The inverters INV3 and INV have the same structures as those of the inverters INV1 and INV2, a gain control signal that is input from the GC2 terminal via an electrostatic protective resistor Resd2 is shifted in level by the inverters INV3, INV4 and output from the forward terminal GC2A to the logic portion 13.

In the semiconductor apparatus 10, 1.8 [V] is set as the high-level voltage of the gain control signal that is input to the GC1 terminal and the GC2 terminal, and a voltage range of 2.4 to 3.6 [V] is set as the input range of the power-supply voltage VCC (see FIG. 5 described above).

Here, if the gain control signal is set to the high level, it is necessary to transmit a low-level signal to the next-stage inverter INV2 by turning off the transistor P1 that composes the inverter INV1, and turning on the transistors N1a, N1b that compose the inverter INV1.

However, if 3.6 [V] is set as the power-supply voltage VCC, because a gate-source voltage of the transistor P1 becomes 1.8 [V] even if the gain control signal is set to the high level (1.8 [V]), the transistor P1 cannot be completely turned off, and a penetration current flows through the transistors P1, N1a, and N1b.

To prevent this, in the level shifter circuit LS having the structure described above has a structure (resistor-type level shifter) in which device design is so carried out as to raise the on resistance of the transistor P1 (e.g., the channel width W/the channel length L=3/300), and a current-limiting resistor R1 is inserted between the drain of the transistor P1 and the drain of the transistor N1a.

According to this structure, even if the transistor P1 cannot be completely turned off, the penetration current that flows through the transistors P1, N1a, and Nib is decreased, thereby it becomes possible to transmit a low-level signal to the next-stage inverter INV2.

As for the on resistance of the transistor P1, even if the high-level voltage of the gain control signal further drops, and even if the power-supply voltage VCC further drops, it is desirable that device design is so suitably carried out as to sufficiently decrease a leak current from the transistor P1.

The logic inversion threshold voltage of the level shifter circuit having the structure described above depends on the on threshold voltage Vth of the transistors N1a, N1b. However, the higher this logic inversion threshold voltage is, the better it is. Accordingly, as the transistors N1a and Nib, it is desirable to use devices (HV relatives) resistant to high voltage that have a higher on threshold voltage Vth.

Next, gain fine adjustment (laser repair trimming of the transistor Q32) of the current amplification stage AMP3 is described in detail.

Figure 18:
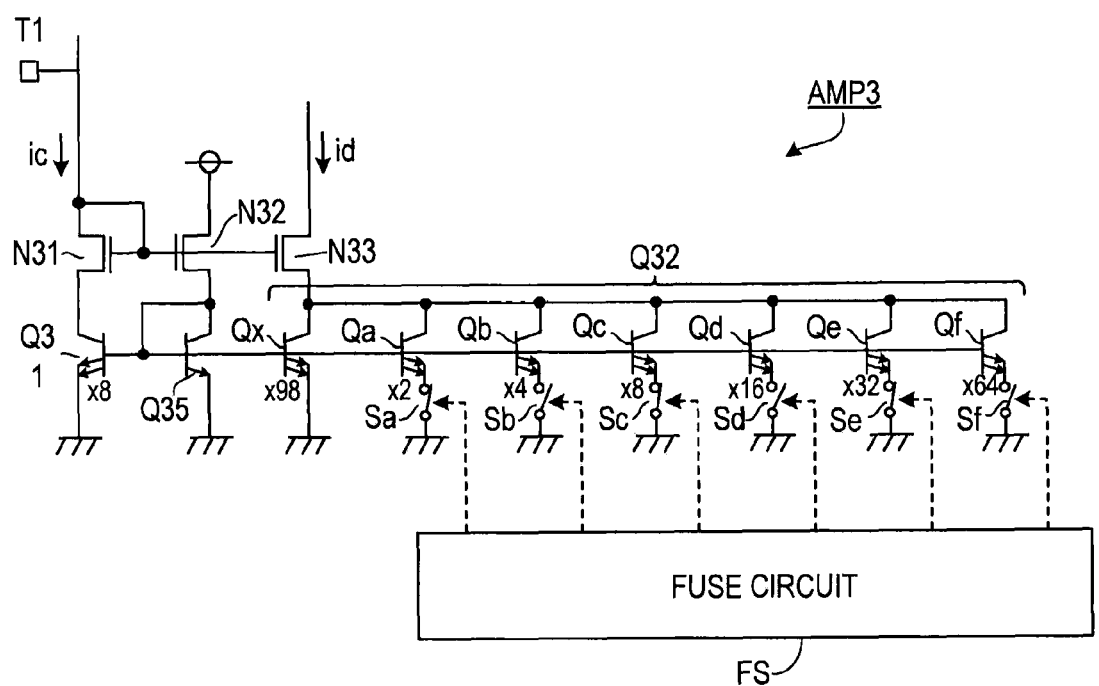
FIG. 18 is a circuit diagram showing a structural example of a transistor Q 32.

FIG. 18 is a circuit diagram showing a structural example of the transistor Q32.

As shown in FIG. 18, the transistor Q32 that composes the current mirror amplifier of the current amplification stage AMP3 includes 7 npn-type bipolar transistors Qa, Qb, Qc, Qd, Qe, Qf, and Qx, and 6 switches Sa, Sb, Sc, Sd, Se, and Sf.

All the collectors of the transistors Qa to Qf, and Qx are connected to the source of the transistor N33. All the bases of the transistors Qa to Qf, and Qx are connected to the base of the transistor Q31. All the emitters of the transistors Qa to Qf are connected to a ground terminal via the switches Sa to Sf. The emitter of the transistor Qx is directly connected to the ground terminal. The emitter-area proportion among the transistors Qa to Qf, and Qx is set to 2:4:8:16:32:64:98.

A fuse circuit FS performs on/off control of the switches Sa to Sf depending on whether or not 6-bit fuses (not shown) are blown out by laser repair trimming, and further performs fine adjustment of the emitter area of the transistor Q32. In a default state where no fuses are blown out, the switches Sa, Sc, and Se are turned on, and the switches Sb, Sd, and Sf are turned off. Accordingly, in the default state, the emitter-area proportion between the transistors Q31 and Q32 becomes 8:140 (=1:17.5).

Besides, a pad T1 to flow a test current in evaluating the gain adjustment is disposed at the input terminal of the current amplification stage AMP3. To perform the gain adjustment of the current amplification stage AMP3, first, a test current is given from the pad T1, an output current that appears at the IOUT terminal is monitored to measure a deviation from a target value, then, laser repair trimming of the fuse circuit FS is so carried out as to minimize the deviation.

As described above, in the semiconductor apparatus 10 having the above structure, because the gain of the current amplification stage AMP3 can be finely adjusted by laser repair trimming, it becomes possible to dramatically reduce sensitivity fluctuation to illumination (devices: ±20% to ±2%, the total: ±35% to ±15%).

The pad T1 is an internal pad that is not seen from outside after the semiconductor apparatus 10 is packaged, and is used only during the time of performing the gain adjustment on a wafer (non-package stage). According to this structure, as for a finished product of the semiconductor apparatus 10, unnecessary increase in the number of pins is prevented.

In this structure, the fuse circuit FS is described as an example of a holding circuit for a 6-bit signal that is used for the on/off control of the switches Sa to Sf. However, the structure of the present invention is not limited this, and a non-volatile memory may be used.

Next, changeover control of the current mirror amplifier in the current amplification stage AMP4 is described in detail with reference to FIG. 14 described above.

As described above, the current amplification stage AMP4 includes the first current mirror amplifier that is composed of the pnp-type bipolar transistors Q41, Q42, and the second current mirror amplifier that is composed of the P channel-type MOS Field Effect Transistors Q43, Q44 in parallel with the first current mirror amplifier. The changeover control circuit SW monitors the amplified current id (in the example shown in FIG. 14, a monitor current im that presents behavior identical to that of the amplified current id), and carries out changeover control of the first and second current mirror amplifiers according to a value of the monitored current.

In the semiconductor apparatus 10 according to the present embodiment, the changeover control circuit SW has a structure in which the changeover control circuit SW carries out changeover control of the first and second current mirror amplifiers by dividing the amplified current id input to the current amplification stage AMP4 according to a proportion of the value of the monitor current im and supplying the divided currents to the first and second current mirror amplifiers. Specifically, if the monitor current im has a small value, the changeover control circuit SW supplies a larger portion of the amplified current id to the first current mirror amplifier in which the output current has excellent linearity in a relatively small range of the input current. In contrast, if the monitor current im has a large value, the changeover control circuit SW supplies a larger portion of the amplified current id to the second current mirror amplifier in which the output current has excellent linearity in a relatively large range of the input current.

According to this structure, because the current amplification stage AMP4 can always keep the gain (the mirror portion of the current mirror amplifier) at a desired value as a whole, it is possible to keep the excellent linearity of the output current in a wide illumination range.

Figure 19:
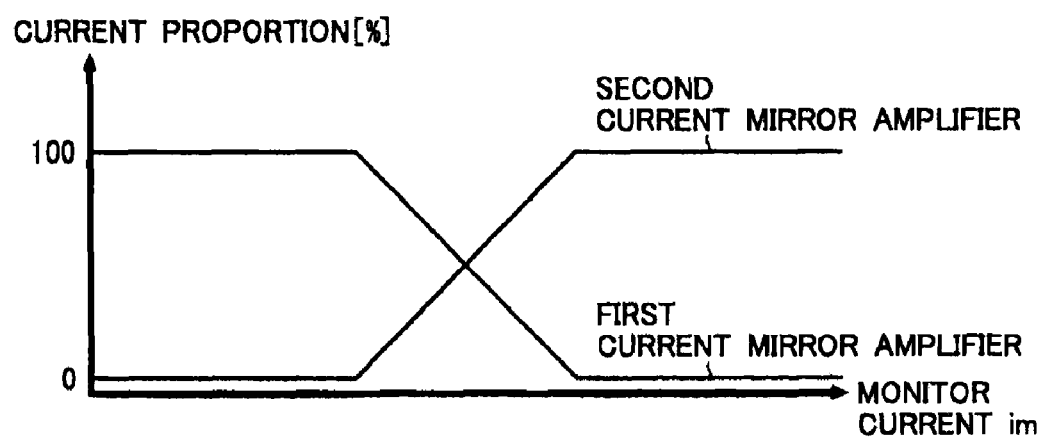
FIG. 19 is a view showing a relationship between a monitor current im and a current proportion.

In particular, as shown in FIG. 19, the changeover control circuit SW has a structure in which in carrying out changeover control of the first and second current mirror amplifiers, the input currents that are supplied to the first and second current mirror amplifiers are slowly increased and decreased in a complementary way. According to this structure, noise appearance due to the changeover control of the current mirror amplifiers can be prevented.

However, in carrying out the changeover control of the first and second current mirror amplifiers, it is not limited to the way described above, and another structure may be used, in which the supply circuit for the amplified current id is changed using a logical circuit depending on whether or not the monitor-current value reaches a given threshold value.

Next, an output saturation limiter function of the semiconductor apparatus 10 is described.

Figure 20A:
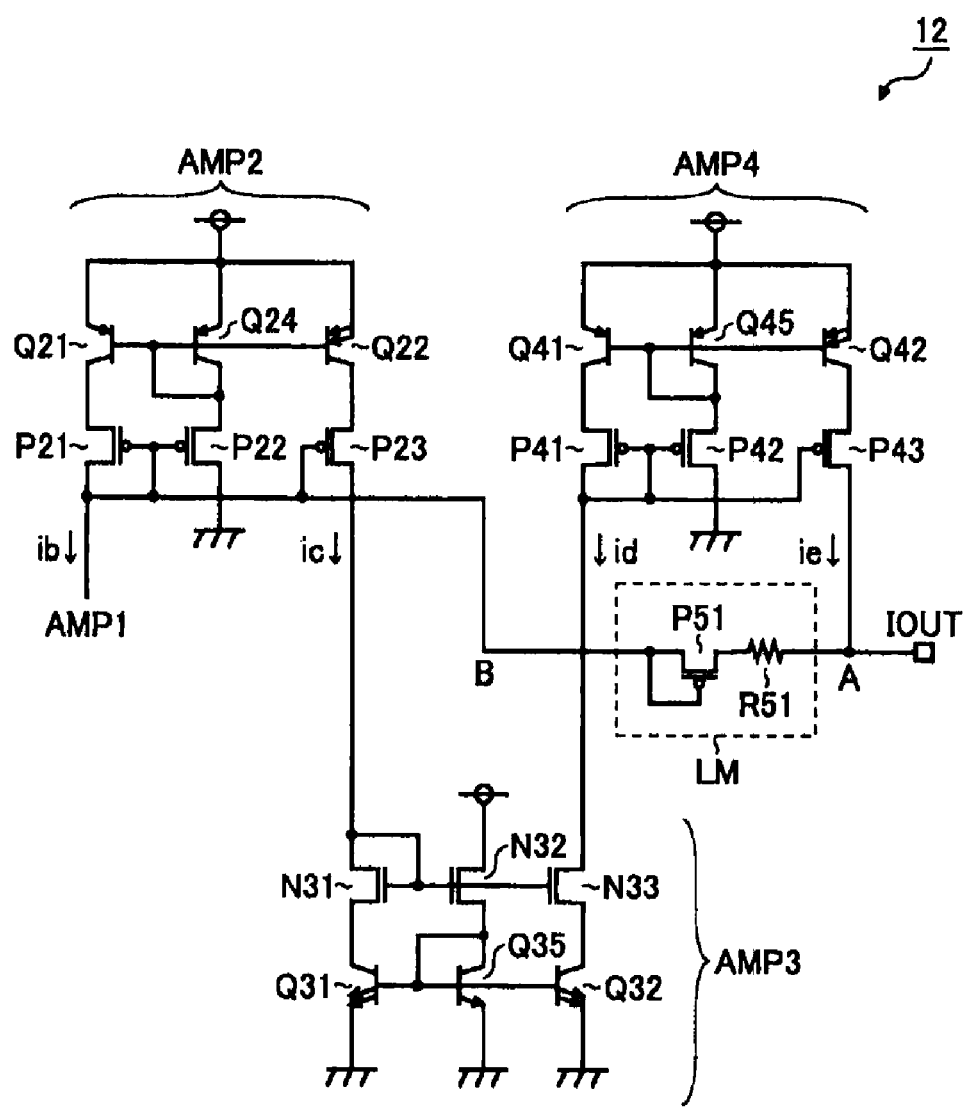
FIG. 20A is a circuit diagram showing a structural example of an output saturation limiter circuit.

FIG. 20A is a circuit diagram sowing a structural example of an output saturation limiter circuit.

As shown in FIG. 20A, the current amplification portion 12 according to the present embodiment includes an output saturation limiter circuit LM disposed across the IOUT terminal and the input terminal (the input terminal for the amplified current ib) of the current amplification stage AMP2. The output saturation limiter circuit LM includes a P channel-type MOS Field Effect Transistor P51, and a resistor R51. The source of the transistor P51 is connected to the IOUT terminal via the resistor R51. Both drain and gate of the transistor P51 are connected to the input terminal (the input terminal for the amplified current ib) of the current amplification stage AMP2.

In the current amplification portion 12 having the structure described above, if the amplified current ie becomes excessively large, and if an A-point voltage VA becomes larger than a B-point voltage VB by a given value (a gate-source drop voltage Vgs of the transistor P51+ a drop voltage across the resistor R51), a current flows into the input terminal of the current amplification stage AMP2 from the IOUT terminal via the output saturation limiter circuit LM. In other words, because the amplified current ib is drawn through both the input terminal of the current amplification stage AMP2 and the IOUT terminal, the proportion of the amplified current ib that is input into the current amplification stage AMP2 decreases. Consequently, because the amplified currents ic, id that are respectively generated by the current amplification stages AMP2, AMP3 decrease, the amplified current ie generated by the current amplification stage AMP4 drops. Because of this feedback, the collector voltage of the transistor Q42 is limited to a given upper limit value, and the transistor Q42 does not reach saturation, thereby it becomes possible to prevent unnecessary current increase (a leak current that flows from the power-supply line to the chip substrate) which occurs at the time of output saturation.

Figure 20B:
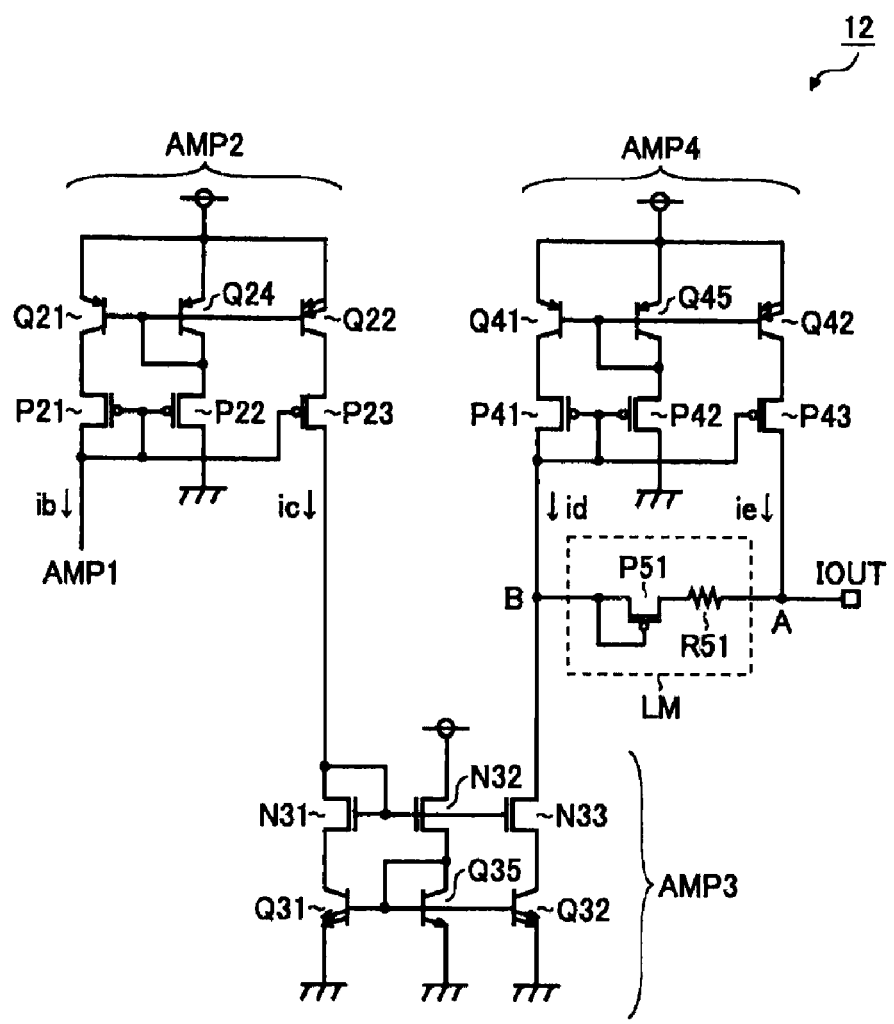
FIG. 20B is a circuit diagram showing another connection example of an output saturation limiter circuit.
Figure 20C:
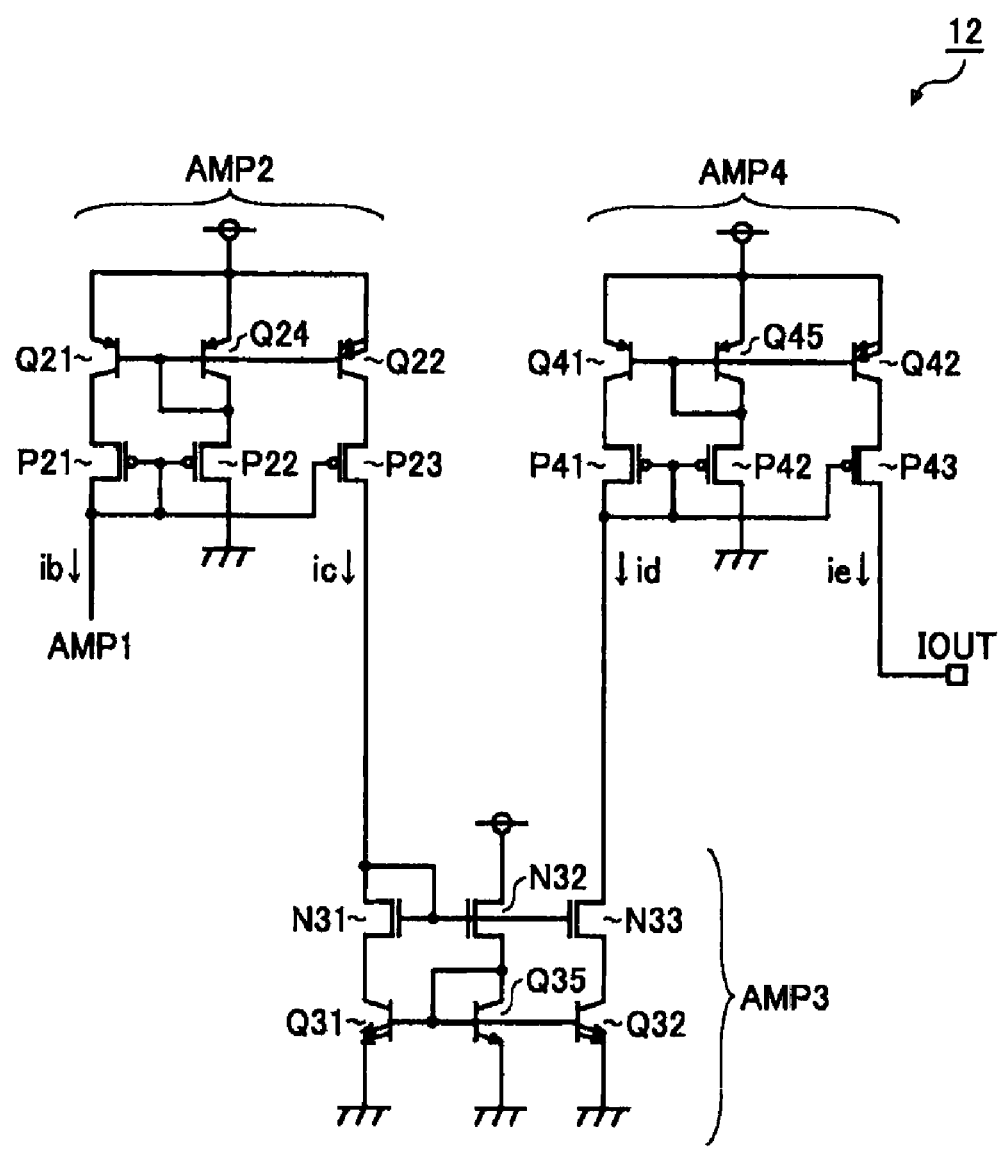
FIG. 20C is a circuit diagram in which an output saturation limiter circuit is not used.

As shown in FIG. 20B, the output saturation limiter circuit LM may be inserted between the IOUT terminal and the input terminal (the input terminal for the amplified current id) of the current amplification stage AMP4. According to this structure, because output oscillation does not easily occur, it becomes possible to carry out stable current amplification. To curb the current flowing in the output saturation limiter circuit LM as small as possible, as described above, it is desirable to insert the output saturation limier circuit LM between the IOUT terminal and the input terminal (the input terminal for the amplified current ib) of the current amplification stage AMP2. Besides, instead of the P channel-type MOS Field Effect Transistor P51, a pnp-type bipolar transistor may be used as the transistor that composes the output saturation limiter circuit LM. If priority is given to avoidance of output oscillation rather than to prevention of unnecessary current increase at the time of output saturation, as shown in FIG. 20C, the output saturation limiter circuit LM may be removed.

Next, a technology to improve power-supply voltage dependency of the detected current is described in detail.

Because a wide voltage range of 2.4 to 5.5 [V] is set as the power-supply voltage input range, it is desirable to curb power-supply voltage dependency of the detected current (the amplified current ie) output from the IOUT terminal as small as possible.

For this purpose, in the semiconductor apparatus 10 according to the present embodiment, all the current mirror amplifiers of the current amplification stages AMP1 to AMP4 that compose the current amplification portion 12 are in cascode connection.

In FIGS. 20A to 20C described above, circuit examples are illustrated, in which each of the current mirror amplifiers of the current amplification stages AMP2, AMP3, and AMP4 is in cascode connection.

The current amplification stage AMP2 includes the pnp-type bipolar transistor Q24, and the P channel-type MOS Field Effect Transistors P21 to P23 besides the transistors Q21, Q22. All the emitters of the transistors Q21, Q22, and Q24 are connected to a power-supply line. All the bases of the transistors Q21, Q22, and Q24 are connected to the collector of the transistor Q24. The collector of the transistor Q21 is connected to the source of the transistor P21. The collector of the transistor Q22 is connected to the source of the transistor P23. The collector of the transistor Q24 is connected to the source of the transistor P22. All the gates of the transistors P21 to P23 are connected to the drain of the transistor P21. The drain of the transistor P21 is connected to the input terminal for the amplified current ib. The drain of the transistor P22 is connected to a ground terminal. The drain of the transistor P23 is connected to the output terminal for the amplified current ic.

The current amplification stage AMP3 includes the npn-type bipolar transistor Q35, and the N channel-type MOS Field Effect Transistors N31 to N33 besides the transistors Q31, Q32. Because the connection among the devices is already described with reference to FIG. 16, double description of the connection is skipped. As for each of the current mirror amplifier of the current amplification stage AMP1 that is not shown, the structure is the same as that of the current amplification stage AMP3.

The first current mirror amplifier of the current amplification stage AMP4 includes the pnp-type bipolar transistor Q45, and the P channel-type MOS Field Effect Transistors P41 to P43 besides the transistors Q41, Q42. All the emitters of the transistors Q41, Q42, and Q45 are connected to a power-supply line. All the bases of the transistors Q41, Q42, and Q45 are connected to the collector of the transistor Q45. The collector of the transistor Q41 is connected to the source of the transistor P41. The collector of the transistor Q42 is connected to the source of the transistor P43. The collector of the transistor Q45 is connected to the source of the transistor P42. All the gates of the transistors P41 to P43 are connected to the drain of the transistor P41. The drain of the transistor P41 is connected to the input terminal for the amplified current id. The drain of the transistor P42 is connected to a ground terminal. The drain of the transistor P43 is connected to the output terminal (the IOUT terminal) for the amplified current ie. As for the second current mirror amplifier of the current amplification stage AMP4 that is not shown, the structure is the same as that of the first current mirror amplifier.

According to the cascode-type current mirror amplifiers, because power-supply voltage dependence of the amplified currents ib to ie which are respectively generated by the current amplification stages AMP1 to AMP4 can be improved, it becomes possible to reduce power-supply voltage dependence of the detected current (the amplified current ie), which is eventually output via the IOUT terminal, to about 3%/V.

Next, light-compensation of bipolar transistors that are integrated in the semiconductor apparatus 10 is described in detail.

Figure 21:
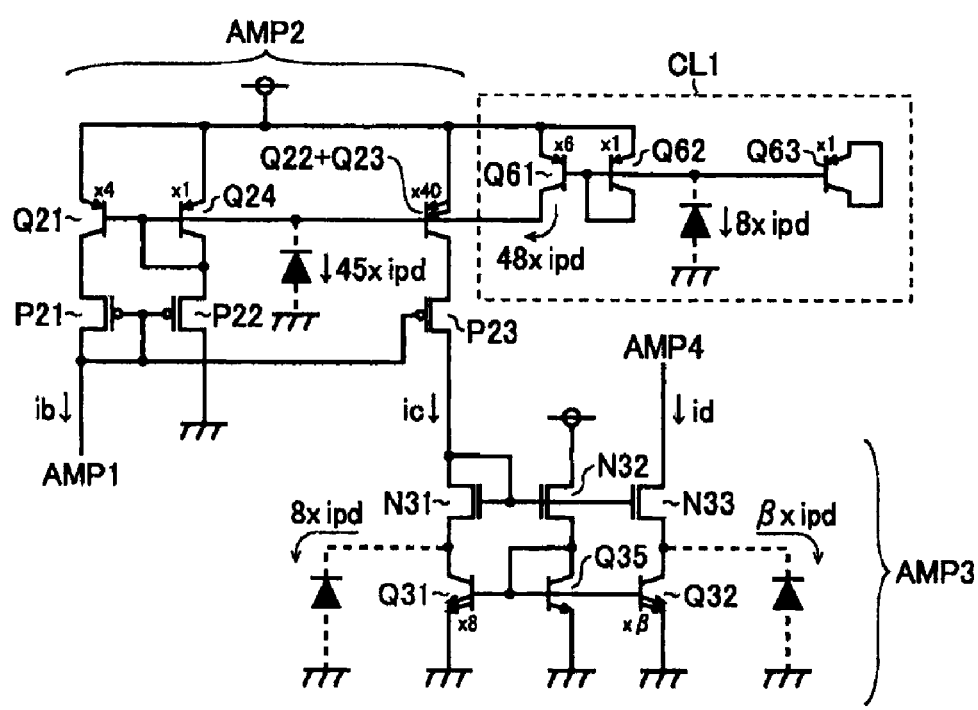
FIG. 21 is a view to describe light-current compensation by bipolar transistors.

FIG. 21 is a circuit diagram to describe light-current compensation of bipolar transistors.

The chip upper surface of the semiconductor apparatus 10 is shielded from light by aluminum except the light receiving area of the light receiving portion 11. However, the chip side surfaces of the semiconductor apparatus 10 are still exposed after they are formed at the time of dicing, and no special light shielding is taken. Accordingly, incident light (especially, infrared light) through the chip side surfaces is received by parasitic photodiodes that are present between the base of the pnp-type bipolar transistor and the chip substrate, and between the collector of the npn-type bipolar transistor and the chip substrate, which can adversely affect the gain (also, illumination detection accuracy) of the current amplification stage 12.

To avoid this, in the semiconductor apparatus 10 according to the present embodiment, a light-current compensation circuit CL is added to compensate a current equal to a current that flows in the parasitic photodiodes, and the device layout of the bipolar transistors is devised, thereby the circuit operation is stabilized.

First, light-current compensation of the pnp-type transistors is described in detail using the current amplification stage AMP2 as an example.

As described above, a parasitic photodiode is present between the base of the pnp-type bipolar transistor and the chip substrate. In the example shown in FIG. 21, parasitic photodiodes are present between the common base of the transistors Q21 to Q24 and the chip substrate. If incident light through the chip side surfaces hits the parasitic photodiodes, a light current (45×ipd) proportionate to the total emitter area of the transistors Q21 to Q24 flows.

To prevent this, a light-current compensation circuit CL1 is so structured as to flow a compensation current larger than the above-described light current into the common base of the transistors Q21 to Q24 so that the light current flowing in the parasitic photodiodes is cancelled. Specifically, the light-current compensation circuit CL1 includes pnp-type bipolar transistors Q61 to Q63. The emitters of the transistors Q61, Q62 are connected to a power-supply line. The emitter of the transistor Q63 is connected to the collector of the transistor Q63. The collector of the transistor Q61 is connected to the common base of the transistors Q21 to Q24. All the bases of the transistors Q61 to Q63 are connected to the collector of the transistor Q62. The emitter-area proportion among the transistors Q61, Q62, and Q63 is set to 6:1:1.

In the light-current compensation circuit having the above structure, parasitic photodiodes are present between the common base of the transistors Q61 to Q63 and the chip substrate, and if incident light through the chip side surfaces hits the parasitic photodiodes, a light current (8×ipd) proportionate to the total emitter area of the transistors Q61 to Q63 flows. This light current is amplified to a 6-fold current by the current mirror amplifier composed of the transistors Q61, Q62, and is flown into the common base of the transistors Q21 to Q24 as a compensation current (48×ipd). Because the light current (45×ipd) flowing in the parasitic photodiodes that are present between the common base of the transistors Q21 to Q24 and the chip substrate can be cancelled by the compensation current (48×ipd), it becomes possible to stably keep the gain (also, ambient-illumination detection accuracy) of the current amplification portion 12.

In the light-current compensation circuit CL1 having the above structure, a compensation current larger than the light current to be cancelled is flown. However, the surplus current can be flown to the ground terminal through the transistor Q24 that is in cascode connection, which causes no trouble with the circuit operation.

Next, light-current compensation of the npn-type transistor is described in detail using the current amplification stage AMP3 as an example.

As described above, a parasitic photodiode is present between the collector of the npn-type bipolar transistor and the chip substrate. In the example shown in FIG. 21, parasitic photodiodes are present between the collectors of the transistors Q31 to Q32 and the chip substrate, and if incident light through the chip side surfaces hits the parasitic photodiodes, light currents respectively proportionate to the collector areas of the transistors Q31, Q32 flow.

Here, in the current mirror amplifier composed of the npn-type bipolar transistors, if the emitter-area proportion between the transistors Q31 and Q32 is identical to the collector-area proportion between the transistors Q31 and Q32, as presented by the following expression (1), even if no special light-compensation circuit is disposed, the light currents (8×ipd, 100×ipd) flowing in the parasitic photodiodes can cancel each other out in the process that the amplified current ic is amplified by the current mirror circuit to generate the amplified current id.

$$id = \{ic - (8 \times ipd)\} \times 100/8 + (100 \times ipd) = 100/8 \times ic \qquad (1)$$

On the other hand, if the emitter-area proportion between the transistors Q31 and Q32 is not identical to the collector-area proportion between the transistors Q31 and Q32, it is necessary to dispose a light-current compensation circuit LC2 in the current amplification stage AMP3 as well. For example, in a case where the emitter-area proportion between the transistors Q31 and Q32 is 1:10, and the collector-area proportion between the transistors Q31 and Q32 is 1:1, if no light-current compensation is applied, the amplified current id becomes a value given by the following expression (2), and a current value to be generated cannot be obtained.

$$id = \{ic - (1 \times ipd)\} \times 10 + (1 \times ipd) \qquad (2)$$
$$= 10 \times ic - 9 \times ipd$$

Figure 22:
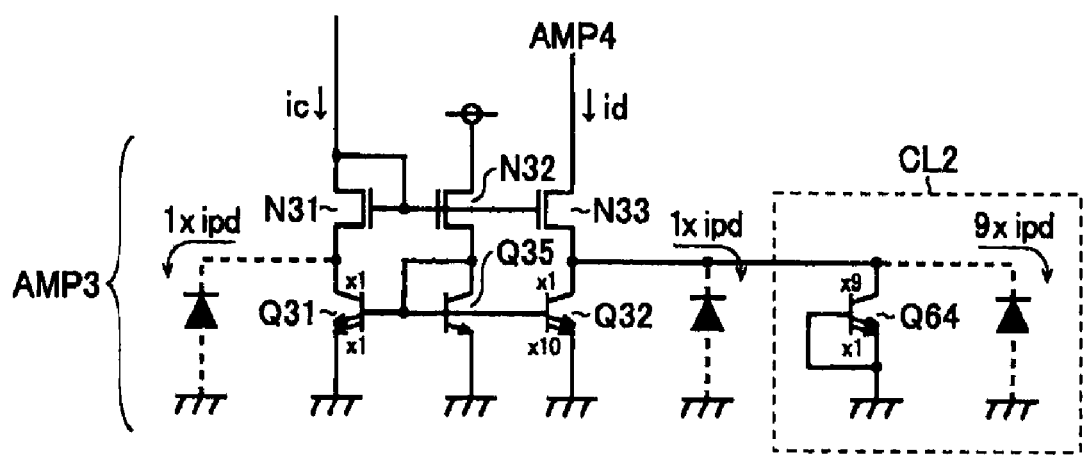
FIG. 22 is a circuit diagram showing a structural example of a light-current compensation circuit CL2.

To prevent this disadvantage, as shown in FIG. 22, the light-current compensation circuit LC2 composed of an npn-type bipolar transistor Q64 is disposed to draw a compensation current (9×ipd) from the collector of the transistor Q32, thereby the light-current deviation (9×ipd) can be cancelled by the compensation current (9×ipd), and it becomes possible to stably keep the gain (also, ambient-illumination detection accuracy) of the current amplification portion 12.

In fabricating the semiconductor apparatus 10, the layout needs to be so taken into consideration that incident light through the side surfaces is evenly radiated to both the bipolar transistors composing the current amplification stages AMP1 to AMP4 and the bipolar transistors composing the light-current compensation circuits CL1, CL2.

Figure 23:
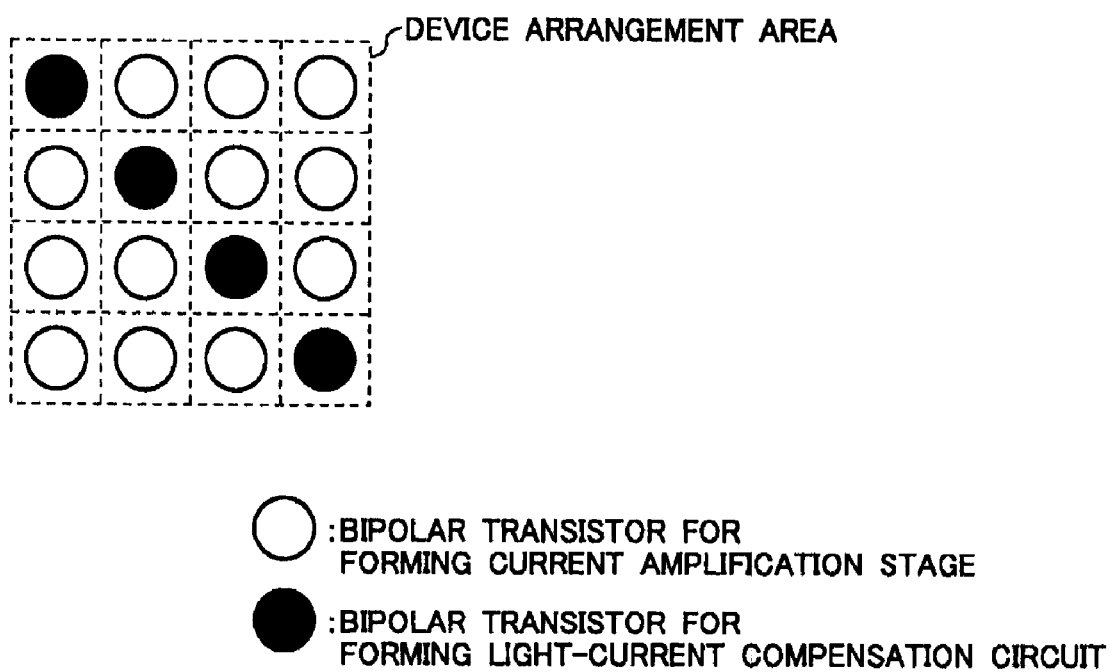
FIG. 23 is a schematic view showing a device layout example of bipolar transistors.

For example, in a case where n bipolar transistors each having an emitter area of 1 unit are arranged to form a bipolar transistor apparatus that has an emitter area of n units, as shown in FIG. 23, the bipolar transistors (indicated by the white circles ○ in FIG. 23) composing the current amplification stages AMP1 to AMP4, and the bipolar transistors (indicated by the black circles ● in FIG. 23) composing the light-current compensation CL1, CL2 are equally dispersed and arranged on a given device arrangement area, thus even if light hits the semiconductor apparatus 10 from any directions, a current flowing in the parasitic photodiodes can be equalized, and further, effect of the light-current compensation described above can be raised.

Next, a way of making a MOS Field Effect Transistor and an electrostatic protective device resistant to high voltage is described.

To allow operation on 5.5 [V] of the power-supply input voltage VCC, in the semiconductor apparatus 10, all the MOS Field Effect Transistors (MOS Field Effect Transistors and switches composing the logic portion 12, the level shifter circuit LS, the fuse circuit FS, and the current amplification stages AMP1 to AMP4) that are integrated in the apparatus are made resistant to high voltage (HV operatable). It is relatively easy to achieve these devices resistant to high voltage by lengthening the distance between the P-type impurity diffusion region and the N-type impurity diffusion region, and the distance between the devices and the isolation layer.

In addition, in the semiconductor apparatus 10, besides the MOS Field Effect Transistors made resistant to high voltage, a device (shrink version) resistant to high voltage is used for the electrostatic protective device as well.

Moreover, in connection with the other layouts, in the semiconductor apparatus 10, to integrate additional circuits described above on a conventional-size chip substrate, reduction in laser repair alignment mark, mask-version shrink, and rocket mark, and the like are performed.

Besides the embodiments described above, the structures according to the present invention can be modified in various ways without departing from the spirit of the present invention.

As for industrial applicability of the present invention, the ambient light sensor according to the present invention is incorporated in electronic apparatuses such as a mobile phone, a liquid crystal display television, a plasma television, a notebook computer, a mobile game machine, a digital still camera, a digital camcorder, a car navigation apparatus, a PDA, and a liquid crystal display, and can be preferably used as a means for detecting ambient illumination.

In the above description, the best embodiments of the present invention are explained. However, the disclosed invention can be modified in various ways, and it is apparent to those skilled in the art that various embodiments different from the structures specifically described above are possible. Accordingly, the following claims are intended to read on all modifications of the present invention without departing from the spirit and technological concept of the present invention.

What is claimed is:

1. An ambient light sensor comprising:
    a plurality of light receiving units;
    wherein each of the light receiving units includes first and second photoelectric transducing devices that have different light-receiving characteristics, and wherein each of the light receiving units is arranged to calculate a difference between light currents that are respectively generated by the first and second photoelectric transducing devices;
    wherein the ambient light sensor is arranged to totalize the difference calculation results from the light receiving units to generate an output signal;
    wherein the plurality of light receiving units are arranged to perform the calculation of the difference between the light currents according to proportions different from each other.

2. The ambient light sensor according to claim 1 wherein the first and second photoelectric transducing devices have light-receiving area proportions that are different from each other among the plurality of light receiving units.

3. The ambient light sensor according to claim 2, wherein the first and second photoelectric transducing devices are arranged on a chip upper surface so that the first and second photoelectric transducing devices are identical to each other in optical characteristic among the plurality of light receiving units.

4. The ambient light sensor according to claim 3 wherein some photoelectric transducing devices of the first and second photoelectric transducing devices are separately arranged on a different position so that said some photoelectric transducing devices are identical to each other in optical characteristic among the plurality of light receiving units.

5. The ambient light sensor according to claim 1 further comprising a bias circuit that keeps a potential difference across both terminals of each of the first and second photoelectric transducing devices at a constant value.

6. The ambient light sensor according to claim 1 wherein the first photoelectric transducing device is a photodiode that includes a PN junction composed of a P-type impurity diffusion layer and an N-type impurity diffusion layer.

7. The ambient light sensor according to claim 6 wherein
    the second photoelectric transducing device is a photodiode that includes a PN junction composed of the N-type impurity diffusion layer and a P-type substrate; and
    a peak sensitivity wavelength of the second photoelectric transducing device is longer than a peak sensitivity wavelength of the first photoelectric transducing device.

8. The ambient light sensor according to claim 5 wherein the bias circuit includes:
    a first bias circuit that keeps a potential difference across both terminals of the first photoelectric transducing device at a constant value;
    a second bias circuit that maintains a potential difference across both terminals of the second photoelectric transducing device at a constant value;
    wherein the first bias circuit includes:
        a first transistor that is connected to a first terminal of the first photoelectric transducing device;
        a first diode having an anode connected to a second terminal of the first photoelectric transducing device and having a cathode connected to a control terminal of the first transistor; and
        a first constant-current source connected across the cathode of the first diode and a ground terminal;
    wherein the second bias circuit includes:
        a second transistor connected to a first terminal of the second photoelectric transducing device;
        a second diode having a cathode connected to a second terminal of the second photoelectric transducing device and having an anode connected to a control terminal of the second transistor; and
        a second constant-current source connected across the anode of the second diode and a power-supply terminal.

9. The ambient light sensor according to claim 1 further comprising:
    a first current amplification stage that amplifies a plurality of difference currents that are respectively input from the plurality of light receiving units, and that totalizes the amplified difference currents to generate a first amplified current;
    a second current amplification stage that further amplifies the first amplified current to generate a second amplified current;
    a third current amplification stage that further amplifies the second amplified current to generate a third amplified current; and
    a fourth current amplification stage that further amplifies the third amplified current to generate a fourth amplified current.

10. The ambient light sensor according to claim 9 wherein the third current amplification stage includes:
    first to fourth npn-type transistors; and
    first and second switches;

wherein collectors of the first and third transistors are connected to an input terminal of the second amplified current;
emitters of the first and second transistors are all connected to a ground terminal;
an emitter of the third transistor is connected to the ground terminal via the first switch;
bases of the first to third transistors are all connected to a collector of the first transistor and also connected to the ground terminal via the second switch;
a collector of the second transistor is connected to an output terminal of the third amplified current;
a collector of the fourth transistor is connected to an amplified-current detection terminal of a changeover control circuit;
an emitter of the fourth transistor is connected to the ground terminal; and
a base of the fourth transistor is connected to the base of the first transistor and also connected to the collector of the fourth transistor.

11. The ambient light sensor according to claim 9 wherein the third current amplification stage includes:
first to fourth npn-type transistors;
fifth to eighth N channel-type transistors; and
first and second switches;
wherein emitters of the first, second, and fourth transistors are all connected to a ground terminal;
an emitter of the third transistor is connected to a common terminal of the first switch;
a first selection terminal of the first switch is connected to a base of the third transistor;
a second selection terminal of the first switch is connected to the ground terminal;
bases of the first to fourth transistors are all connected to a collector of the fourth transistor;
a collector of the first transistor is connected to a source of the fifth transistor;
a collector of the second transistor is connected to a source of the seventh transistor;
a collector of the fourth transistor is connected to a source of the sixth transistor;
gates of the fifth to eighth transistors are all connected to a drain of the fifth transistor;
the drain of the fifth transistor is connected to an input terminal of the second amplified current;
a drain of the sixth transistor is connected to a power-supply line;
a drain of the seventh transistor is connected to an output terminal of the third amplified current;
a drain of the eighth transistor is connected to a common terminal of the second switch;
a first selection terminal of the second switch is connected to the power-supply line; and
a second selection terminal of the second switch is connected to the drain of the fifth transistor.

12. The ambient light sensor according to claim 1 further comprising:
a mode setting terminal; and
a level shifter circuit that performs a level shift of an input signal to the mode setting terminal;
wherein the level shifter circuit includes:
first and second inverters that are disposed on a signal route of the input signal;
wherein the first inverter includes:
a first P channel-type transistor;
second and third N channel-type transistors; and
a resistor;
wherein the second inverter includes:
a fourth P channel-type transistor; and
a fifth N channel-type transistor;
wherein a source of the first transistor is connected to a power-supply line;
a drain of the first transistor is connected to a drain of the second transistor via the resistor;
a source of the second transistor is connected to a drain of the third transistor;
a source of the third transistor is connected to a ground terminal;
gates of the first to third transistors are all connected to the mode setting terminal;
a source of the fourth transistor is connected to the power-supply line;
a source of the fifth transistor is connected to the ground terminal;
gates of the fourth and fifth transistors are all connected to the drain of the second transistor; and
drains of the fourth and fifth transistors are connected to an output terminal of the level shifter circuit.

13. The ambient light sensor according to claim 11 wherein the second transistor includes:
a plurality of npn-type transistors; and
a plurality of switches that are respectively connected across emitters of the plurality of npn-type transistors and the ground terminal;
wherein the ambient light sensor further includes:
a fuse circuit that performs on/off control of the plurality of switches according to blown-out states of the plurality of fuses.

14. The ambient light sensor according to claim 9 further comprising:
an output saturation limiter circuit that is connected across an output terminal of the output signal and an input terminal of the second current amplification stage.

15. The ambient light sensor according to claim 9 further comprising:
an output saturation limiter circuit connected across an output terminal of the output signal and an input terminal of the fourth current amplification stage.

16. The ambient light sensor according to claim 9 further comprising:
a light-current compensation circuit that flows a compensation current into a common base of a plurality of transistors that compose a current mirror circuit of the second current amplification stage.

17. The ambient light sensor according to claim 9 further comprising:
a light-current compensation circuit that draws a compensation current from a collector of an output-side transistor that composes a current mirror circuit of the third current amplification stage.

* * * * *